US008603588B2

(12) United States Patent
Kohmura et al.

(10) Patent No.: US 8,603,588 B2
(45) Date of Patent: Dec. 10, 2013

(54) COMPOSITION AND METHOD FOR PRODUCTION THEREOF, POROUS MATERIAL AND METHOD FOR PRODUCTION THEREOF, INTERLAYER INSULATING FILM, SEMICONDUCTOR MATERIAL, SEMICONDUCTOR DEVICE, AND LOW-REFRACTIVE-INDEX SURFACE PROTECTION FILM

(75) Inventors: Kazuo Kohmura, Ichihara (JP); Hirofumi Tanaka, Tsukuba (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 373 days.

(21) Appl. No.: 12/934,767

(22) PCT Filed: Mar. 30, 2009

(86) PCT No.: PCT/JP2009/056484
§ 371 (c)(1),
(2), (4) Date: Sep. 27, 2010

(87) PCT Pub. No.: WO2009/123104
PCT Pub. Date: Oct. 8, 2009

(65) Prior Publication Data
US 2011/0018108 A1    Jan. 27, 2011

(30) Foreign Application Priority Data
Apr. 2, 2008 (JP) ................................. 2008-096449

(51) Int. Cl.
*B05D 3/02* (2006.01)
*B05D 3/06* (2006.01)
*C09D 183/06* (2006.01)

(52) U.S. Cl.
USPC ......... 427/387; 427/97.1; 427/97.6; 427/515; 106/287.12; 106/287.13; 106/287.16; 528/14; 528/17; 528/19

(58) Field of Classification Search
None
See application file for complete search history.

(56) References Cited

U.S. PATENT DOCUMENTS

| | | | | |
|---|---|---|---|---|
| 2,891,920 | A | * | 6/1959 | Hyde et al. .................... 524/714 |
| 6,417,310 | B1 | | 7/2002 | Omura et al. |
| 2004/0188809 | A1 | | 9/2004 | Ogihara et al. |
| 2005/0096415 | A1 | | 5/2005 | Akiyama et al. |
| 2005/0119360 | A1 | * | 6/2005 | Kawakami et al. .......... 521/77 |
| 2006/0040110 | A1 | | 2/2006 | Kohmura et al. |
| 2008/0114115 | A1 | | 5/2008 | Iida et al. |
| 2009/0018247 | A1 | | 1/2009 | Iida et al. |
| 2009/0025609 | A1 | * | 1/2009 | Egami et al. .............. 106/287.12 |
| 2009/0053503 | A1 | * | 2/2009 | Fujii et al. .................. 428/304.4 |
| 2009/0179357 | A1 | * | 7/2009 | Murakami et al. ............ 264/414 |

FOREIGN PATENT DOCUMENTS

| | | | |
|---|---|---|---|
| JP | 2001-163981 A | | 6/2001 |
| JP | 2001-287909 | * | 10/2001 |
| JP | 2004-210579 | * | 7/2004 |
| JP | 2004-292641 A | | 10/2004 |
| JP | 2005-120355 A | | 5/2005 |
| JP | 2005-225689 A | | 8/2005 |
| JP | 2006-265350 A | | 10/2006 |
| JP | 2006-291106 A | | 10/2006 |
| JP | 2006-291107 A | | 10/2006 |
| JP | 2008-120911 A | | 5/2008 |
| TW | I225086 | | 12/2004 |
| TW | 2007-12000 A | | 4/2007 |
| WO | WO 00/39028 A1 | | 7/2000 |
| WO | WO 2004/026765 A1 | | 4/2004 |
| WO | WO 2006/101027 | * | 9/2006 |
| WO | WO 2007/020878 A1 | | 2/2007 |
| WO | WO 2007/072750 | * | 6/2007 |
| WO | WO 2007/142000 A1 | | 12/2007 |

OTHER PUBLICATIONS

Machine-generated translation of JP 2004-210579 into English.*
Machine-generated translation of JP 2001-287909 into English.*
International Search Report (PCT/ISA/210) dated Jun. 16, 2009.
Written Opinion (PCT/ISA/237) dated Jun. 16, 2009.
Taiwanese Office Action dated Oct. 18, 2012, issued in corresponding Taiwanese Patent Application No. 098111001.

* cited by examiner

Primary Examiner — Marc Zimmer
(74) Attorney, Agent, or Firm — Buchanan Ingersoll & Rooney PC

(57) ABSTRACT

Disclosed is a composition comprising a hydrolysate of an alkoxysilane compound, a hydrolysate of a siloxane compound represented by Formula (1), a surfactant, and an element having an electronegativity of 2.5 or less. In Formula (1), $R^A$ and $R^B$ independently represent a hydrogen atom, a phenyl group, $-C_aH_{2a+1}$, $-(CH_2)_b(CF_2)_cCF_3$ or $-C_dH_{2d-1}$, $R^A$ and $R^B$ are not both hydrogen atoms simultaneously, $R^C$ and $R^D$ independently represent a single bond that links a silicon atom and an oxygen atom to form a cyclic siloxane structure, or each independently represent a hydrogen atom, a phenyl group, $-C_aH_{2a+1}$, $-(CH_2)_b(CF_2)_cCF_3$, or $-C_dH_{2d-1}$, a represents an integer of 1 to 6, b represents an integer of 0 to 4, c represents an integer of 0 to 10, d represents an integer of 2 to 4, and n represents an integer of 3 or greater.

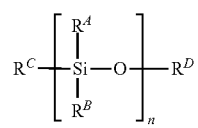

(1)

9 Claims, 10 Drawing Sheets

COMPOSITION AND METHOD FOR PRODUCTION THEREOF, POROUS MATERIAL AND METHOD FOR PRODUCTION THEREOF, INTERLAYER INSULATING FILM, SEMICONDUCTOR MATERIAL, SEMICONDUCTOR DEVICE, AND LOW-REFRACTIVE-INDEX SURFACE PROTECTION FILM

TECHNICAL FIELD

The present invention relates to a composition and a method for production thereof, a porous material and a method for production thereof, an interlayer insulating film, a semiconductor material, a semiconductor device, and a low-refractive-index surface protection film.

BACKGROUND ART

Porous inorganic oxides having uniform mesopores, which are synthesized by utilizing self-organization of an organic compound and an inorganic compound, are known to have a large pore volume, a large surface area, or the like, as compared with conventional porous inorganic oxides such as zeolite. Application of these porous inorganic oxides to a catalyst carrier, a separation absorbent, a fuel cell, a sensor, or the like has been investigated, for example, in the form of a film.

One problem in using a porous silica film, which is one of the oxides having uniform mesopores, for optical functional materials, electronic functional materials and the like, especially for semiconductor interlayer insulating films, is how to satisfy both the porosity and the mechanical strength of the film. Specifically, when the porosity of the film is increased, the density of the film is decreased. As a result, the relative dielectric constant of the film is decreased to come close to 1, which is a relative dielectric constant of air. On the other hand, when the porosity is increased, internal spaces are increased and the mechanical strength is lowered to a considerable degree.

Further, since the mesopores of the porous silica have a significantly large surface area and have silanol (Si—OH) groups on the surface thereof, $H_2O$, which has a high relative dielectric constant, is easily adsorbed thereto. Accordingly, there is a problem in that the relative dielectric constant, which has been lowered by increasing the porosity, is increased to the contrary as a result of increasing the adsorption.

As a method for preventing the adsorption of $H_2O$, a method is proposed in which a hydrophobic functional group is introduced into a film, for example, a method in which the adsorption of water is prevented by trimethylsilylating the silanol groups in the pores (see the pamphlet of International Publication WO00/39028).

In addition, it is reported that not only the hydrophobic property but also the mechanical strength of a porous film composed of a Si—O bond can be improved by allowing the same to contact a cyclic siloxane compound in the absence of a metal catalyst (see the pamphlet of International Publication WO2004/026765).

These methods achieve improvements in not only the hydrophobic property but also the mechanical strength. However, since these methods require a special apparatus for treating a porous film with a cyclic siloxane compound or facilities for disposing of an exhaust gas, there has been demand for a simpler treatment method.

Further, there is a report in which an alkali metal compound is included in a silica-based film-forming composition for the purpose of improving the performance thereof by the addition of an additive (see Japanese Patent Application Laid-Open No. 2006-291107). It is also reported that examples of the alkali metal include sodium, lithium, potassium, rubidium and cesium, and that the inclusion of these alkali metal compounds not only lowers the dielectric constant of a silica-based film formed from the silica-based film-forming composition but also improves the mechanical strength thereof and, moreover, improves the storage stability of the porous film-forming composition.

However, in the fields in which even higher accuracy is required in controlling the physical properties, such as the field of a semiconductor, there is a need for higher storage stability of the porous film-forming composition as a raw material for a porous film.

As described above, even with improvements in technologies for producing a porous film suitably used for optical functional materials, electronic functional materials and the like, and proposals of methods for lowering the relative dielectric constant or performing modification in order to increase the mechanical strength, a technique for producing a porous film that satisfies an even lower relative dielectric constant and an even higher mechanical strength, and a technique for producing a porous film-forming composition that exhibits an even improved storage stability, have yet to be established.

DISCLOSURE OF THE INVENTION

Problems to be Solved by the Invention

One object of the present invention is to provide a composition that can produce a porous material that exhibits both a low relative dielectric constant (hereinafter, referred to as "low dielectric constant" in some cases) and a high mechanical strength, as well as superior storage stability, and a method for producing the same.

Another object of the present invention is to provide a porous material that exhibits both a low relative dielectric constant and a high mechanical strength, and a method for forming the same.

Still another object of the present invention is to provide an interlayer insulating film that includes the porous material, a semiconductor material that includes the interlayer insulating film, a semiconductor device that includes the semiconductor material, and a low-refractive-index surface protection film that includes the porous material.

Means For Solving the Problems

The present inventors have conducted extensive studies and, as a result, found that the above-described problems can be solved by a composition including a specific compound, thereby accomplishing the present invention.

Specifically, the means for solving the above-described problems are as follows.

<1> A composition comprising:

(A) a hydrolysate of an alkoxysilane compound;

(B) a hydrolysate of a siloxane compound represented by the following Formula (1);

(C) a surfactant; and (D) an element having an electronegativity of 2.5 or less:

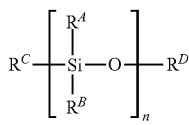
(1)

wherein in Formula (1), $R^A$ and $R^B$ each independently represent a hydrogen atom, a phenyl group, —$C_aH_{2a+1}$, —$(CH_2)_b(CF_2)_cCF_3$ or —$C_dH_{2d-1}$, and $R^A$ and $R^B$ are not both hydrogen atoms simultaneously, $R^C$ and $R^D$ represent a single bond that links a silicon atom and an oxygen atom to form a cyclic siloxane structure, or each independently represent a hydrogen atom, a phenyl group, —$C_aH_{2a+1}$, —$(CH_2)_b(CF_2)_cCF_3$ or —$C_dH_{2d-1}$, a represents an integer of 1 to 6, b represents an integer of 0 to 4, c represents an integer of 0 to 10, d represents an integer of 2 to 4, and n represents an integer of 3 or greater.

<2> The composition according to <1>, wherein the siloxane compound represented by Formula (1) is a cyclic siloxane compound.

<3> The composition according to <1>, wherein the siloxane compound represented by Formula (1) is a cyclic siloxane compound represented by the following Formula (2):

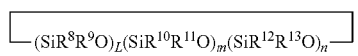
(2)

wherein in Formula (2), $R^8$, $R^9$, $R^{10}$, $R^{11}$, $R^{12}$ and $R^{13}$ each independently represent a hydrogen atom, a phenyl group, —$C_aH_{2a+1}$, —$(CH_2)_b(CF_2)_cCF_3$ or —$C_dH_{2d-1}$, $R^8$ and $R^9$ are not both hydrogen atoms simultaneously, $R^{10}$ and $R^{11}$ are not both hydrogen atoms simultaneously, $R^{12}$ and $R^{13}$ are not both hydrogen atoms simultaneously, a represents an integer of 1 to 3, b represents an integer of 0 to 4, c represents an integer of 0 to 10, d represents an integer of 2 to 4, L represents an integer of 0 to 8, m represents an integer of 0 to 8, n represents an integer of 0 to 8, and L, m and n satisfy the relationship $3 \leq L+m+n \leq 8$.

<4> The composition according to <1>, further comprising (E) a hydrolysate of a disilyl compound represented by the following Formula (3):

$$R^{14}R^{15}R^{16}Si—X—SiR^{17}R^{18}R^{19}$$ (3)

wherein in Formula (3), $R^{14}$, $R^{15}$, $R^{16}$, $R^{17}$, $R^{18}$ and $R^{19}$ each independently represent a hydrogen atom, a phenyl group, —$C_aH_{2a+1}$ or —$(CH_2)_b(CF_2)_cCF_3$, a represents an integer of 1 to 3, b represents an integer of 0 to 4, c represents an integer of 0 to 10, X represents an oxygen atom or >$NR^{20}$, $R^{20}$ represents a hydrogen atom or —$C_eH_{2e+1}$, and e represents an integer of 1 to 3.

<5> The composition according to <1>, wherein (D) the element having an electronegativity of 2.5 or less is an element having an ion radius of 1.6 angstroms or more.

<6> The composition according to <1>, wherein (D) the element having an electronegativity of 2.5 or less is an element having an atomic weight of 130 or more.

<7> The composition according to <1>, wherein (D) the element having an electronegativity of 2.5 or less is at least one element selected from the group consisting of Cs, Ba, La, Hf, Ta, W and a lanthanoid.

<8> A method for producing a composition, the method at least comprising:
a step of mixing at least an alkoxysilane compound, a catalyst and an organic solvent at 20° C. to 70° C. for 0.5 hours to 7 hours;
a step of adding a surfactant to a mixture obtained by the mixing;
a step of concentrating the mixture to which the surfactant has been added until the mass of the mixture becomes 10% to 50%;
a step of diluting the concentrated mixture with an organic solvent;
a step of adding an element having an electronegativity of 2.5 or less to the diluted mixture; and
a step of adding a siloxane compound represented by the following Formula (1) to the mixture to which the element has been added:

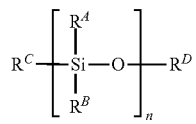
(1)

wherein in Formula (1), $R^A$ and $R^B$ each independently represent a hydrogen atom, a phenyl group, —$C_aH_{2a+1}$, —$(CH_2)_b(CF_2)_cCF_3$ or —$C_dH_{2d-1}$, and $R^A$ and $R^B$ are not both hydrogen atoms simultaneously, $R^C$ and $R^D$ represent a single bond that links a silicon atom and an oxygen atom to form a cyclic siloxane structure, or each independently represent a hydrogen atom, a phenyl group, —$C_aH_{2a+1}$, —$(CH_2)_b(CF_2)_cCF_3$ or —$C_dH_{2d-1}$, a represents an integer of 1 to 6, b represents an integer of 0 to 4, c represents an integer of 0 to 10, d represents an integer of 2 to 4, and n represents an integer of 3 or greater.

<9> A method for forming a porous material, the method comprising:
a step of forming a composition layer by drying the composition according to <1>;
a step of heating the formed composition layer at 80° C. to 400° C.; and
a step of irradiating the heated composition layer with ultraviolet rays.

<10> The method for forming a porous material according to <9>, further comprising a step of carrying out a contact reaction treatment of the composition layer and a silylating agent, after the step of irradiating with ultraviolet rays.

<11> A porous material formed by the method for forming a porous material according to <9>.

<12> The porous material according to <11>, the porous material having a density of from 0.5 g/cm³ to 2.0 g/cm³, and, in a range of from a wavenumber of 1800 cm⁻¹ to a wavenumber of 4800 cm⁻¹ of an infrared ray absorption spectrum,
(I) having one clear absorption peak derived from a C—H stretching movement of an alkyl group;
(II) showing an intensity of an absorption peak derived from an Si—O stretching movement of an SiOH group being not greater than 0.30 times the intensity of the absorption peak intensity derived from the C—H stretching movement of an alkyl group; and
(III) having one clear absorption peak derived from an Si—H stretching movement of an HSiO₃ group, the wavenumber thereof being less than 2300 cm⁻¹, and the intensity thereof being from 0.5 times to 3.0 times as much as the absorption peak intensity derived from the C—H stretching movement of an alkyl group.

<13> An interlayer insulating film comprising the porous material according to <11>.

<14> A semiconductor material comprising the interlayer insulating film according to <13>.

<15> A semiconductor device comprising the semiconductor material according to <14>.

<16> A low-refractive-index surface protection film comprising the porous material according to <14>.

Effects of the Invention

According to the present invention, a porous material that exhibits both a low relative dielectric constant and a high mechanical strength can be produced, and a composition that exhibits superior storage stability and a method for producing the same can be provided.

Further, according to the present invention, a porous material that exhibits a low relative dielectric constant and a high mechanical strength and a method for producing the same can be provided.

Moreover, according to the present invention, an interlayer insulating film including the porous material, a semiconductor material including the interlayer insulating film, a semiconductor device including the semiconductor material, and a low-refractive-index surface protection film including the porous material can be provided.

BEST MODE FOR CARRYING OUT THE INVENTION

Figure 1:
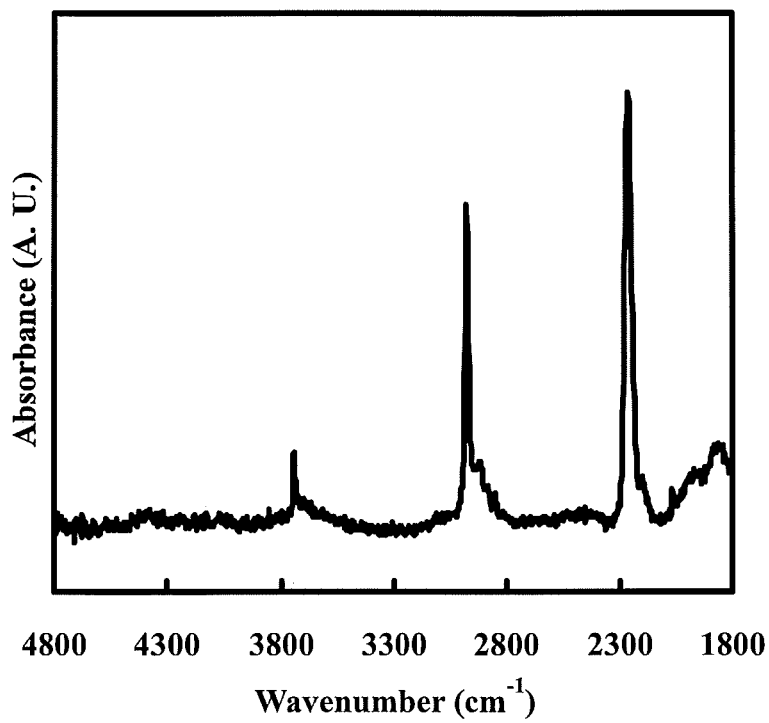
FIG. 1 is an FT-IR spectrum of the porous material according to Example 1.

The composition according to the present invention includes (A) a hydrolysate of an alkoxysilane compound (hereinafter, also referred to as "component (A)"), (B) a hydrolysate of a siloxane compound represented by Formula (1) (hereinafter, also referred to as "component (B)"), (C) a surfactant, and (D) an element having an electronegativity of 2.5 or less (hereinafter, also referred to as "element (D)").

Further, according to an exemplary embodiment of the present invention, the porous material having desired characteristics can be prepared by carrying out: (a) a step of producing the composition; and (b) a step of forming a film using the composition.

Specifically, in the step of producing the composition, the composition is prepared by appropriately hydrolyzing the alkoxysilane compound and the siloxane compound represented by Formula (1) during the process of mixing the alkoxysilane compound, the siloxane compound represented by Formula (1), the surfactant, and the element having an electronegativity of 2.5 or less. This composition may further include (E) a hydrolysate of a disilyl compound represented by Formula (3) (hereinafter, also referred to as "component (E)").

Next, in the step of forming a film, a porous material having desired characteristics can be obtained by applying the composition onto a support, heating the composition, and then irradiating the composition with ultraviolet rays.

Further details of the the present invention are described below.

<(a) Step of Producing the Composition>

In the following, one example of the method for producing the composition are explained.

For example, an alkoxysilane compound is mixed with an organic solvent, a catalyst and water are added thereto, and then hydrolysis is carried out.

As a result, a solution including a hydrolysate of the alkoxysilane compound (component (A)) is obtained.

The amount of the catalyst to be used is not particularly limited, and may be appropriately selected so that the hydrolysis/dehydration condensation of the alkoxysilane compound is promoted. Preferably, the amount of the catalyst is in the range of from 0.1 to 0.001 mole with respect to 1 mole of the alkoxysilane compound. The amount of water used for the hydrolysis is also not particularly limited, and may be appropriately selected from a wide range. Preferably, the amount of water is from 1 to 10 moles with respect to 1 mole of alkoxy groups of the alkoxysilane compound.

The hydrolysis is carried out while stirring, preferably at a temperature of from 0 to 100° C., more preferably from 20 to 70° C., for several minutes to 24 hours, preferably from 0.5 to 7 hours (more preferably from 1 to 7 hours). When the conditions are within these ranges, progression of the hydrolysis reaction can be ensured, and a solution containing a hydrolysate of an alkoxysilane compound (component (A)) can be obtained without causing side reactions.

The hydrolysate as mentioned herein refers to a reaction product in which the conversion rate of the alkoxysilane compound is 90% or higher. The conversion rate can be determined by a conventional analysis method, such as liquid chromatography (LC) or nuclear magnetic resonance spectroscopy (NMR).

Next, surfactant (C) is added to the solution containing component (A) while stirring the same. Surfactant (C) has a function of forming voids during the film formation step. Surfactant (C) at the time of adding the same may be in any form, such as a solid, a liquid, or a solution prepared by dissolving the surfactant in a solvent. The addition amount of surfactant (C) may be appropriately selected according to the design performances or the like of the finally obtained porous material (for example, a porous film), but the molar ratio thereof is desirably from 0.002 to 1 time, preferably from 0.05 to 0.15 times, with respect to Si in component (A). When the amount of surfactant (C) is within this range, formation of voids is not inhibited due to the amount of surfactant (C) being too small, or formation of a film is not inhibited due to the amount of surfactant (C) being too large, thereby making it possible to introduce the voids in the film.

Subsequently, the mixed solution including component (A) and surfactant (C) is concentrated.

The concentration is performed for the purpose of controlling the concentration of component (A) in the solution in order to regulate the thickness of the finally obtained porous material to a desired thickness, and for the purpose of lowering the ratio of water in the mixed solution in order to rapidly drying the porous material in the process of application and heating during the film formation step.

The concentration ratio of the mixed solution may be appropriately selected according to the design performances of the finally obtained porous material, or the conditions for application or heating, but the concentration is preferably carried out until the mass of the mixed solution becomes from 10% to 50% (more preferably from 15% to 30%). Specifically, the concentration is preferably carried out so that the ratio of the mass of the mixed solution after the concentration is from 10% to 50% (more preferably from 15% to 30%) with respect to the mass of the mixed solution before the concentration. When the degree of concentration is within this range, precipitation of a gel due to excessive concentration can be avoided, and formation of a film during application and heating is not inhibited.

After performing the concentration, an organic solvent is added so that the concentration of component (A) is at a certain degree, thereby obtaining a precursor solution of a desired composition.

Subsequently, element (D) is added to this precursor solution and mixed. At this time, element (D) may be added as a simple substance or a compound including the same, alone or in combination of two or more kinds thereof. The purpose of adding element (D) is to increase the reactivity between component (A) and component (B), thereby enhancing the hydrophobicity and the mechanical strength of the finally obtained porous material.

Element (D) may be added in an amount in the range of from 1 to 5000 ppm, preferably from 5 to 100 ppm, more preferably from 10 to 30 ppm. When the amount of element (D) is within this range, reactivity is not too low due to the amount of element (D) being too small, or electric properties of the obtained film are not too low due to the amount of element (D) being too large.

Next, the siloxane compound represented by Formula (1) (for example, a cyclic siloxane compound) is added to the precursor solution to which element (D) has been added. In this case, the siloxane compound represented by Formula (1) may be added as a simple substance or as a solution in which the siloxane compound is dissolved in an organic solvent. The siloxane compound represented by Formula (1) is hydrolyzed by using a catalyst and water that are contained in the precursor solution. Consequently, a hydrolysate of the siloxane compound represented by Formula (1) (component (B)) is formed in the precursor solution.

The hydrolysate as mentioned herein refers to a reaction product in which the conversion rate of the siloxane compound represented by Formula (1) is 90% or higher, and it encompasses a siloxane compound represented by Formula (1) in which a portion thereof is bound to component (A) or the alkoxysilane compound in the precursor solution. By binding to the component (A) or the alkoxysilane compound, the siloxane compound represented by Formula (1) functions to enhance the hydrophobicity and the mechanical strength of the finally obtained porous material.

The conversion rate of the siloxane compound represented by Formula (1) can be determined by a conventional analysis technique, such as liquid chromatography (LC) or nuclear magnetic resonance spectroscopy (NMR).

The addition amount of the siloxane compound represented by Formula (1) may be appropriately selected according to the design performances or the like of the finally obtained porous material, but it is preferably from 0.1 to 100 mol %, more preferably from 0.5 to 50 mol %, further preferably from 1 to 30 mol %, particularly preferably from 5 to 25 mol %, with respect to Si in the alkoxysilane compound (I.e., Si in component (A)). When the amount of the siloxane compound represented by Formula (1) is within this range, it is possible to avoid the lowering of performances of the porous material as a result of lack of necessary amount of component (B) due to the amount of the siloxane compound represented by Formula (1) being too small; and it is possible to avoid the situation in which the hydrolysis reaction does not proceed with the catalyst and water alone, due to the amount of the siloxane compound represented by Formula (1) being too large.

As necessary, a catalyst and water may be added in order to promote the hydrolysis reaction. The hydrolysis is allowed to proceed in a favorable manner by stirring the mixture at a temperature in the range of from 0 to 100° C., preferably from 20 to 70° C., for a period of from several minutes to 24 hours, preferably from 0.5 to 7 hours, after adding the siloxane compound represented by Formula (1).

Further, the disilyl compound represented by Formula (3) may be added to the precursor solution in combination with the siloxane compound represented by Formula (1). In this case, the disilyl compound may be added as a mixture with the siloxane compound represented by Formula (1), or may be added before or after the addition of the siloxane compound represented by Formula (1). The disilyl compound may be added either as a simple substance or as a solution in which the disilyl compound is dissolved in an organic solvent.

The disilyl compound represented by Formula (3) is hydrolyzed with the use of the catalyst and water contained in the precursor solution, whereby a hydrolysate of the disilyl compound (component (E)) is formed in the precursor solution.

The hydrolysate as mentioned herein refers to a reaction product in which the conversion rate of the disilyl compound is 90% or higher, and it encompasses a disilyl compound in which a portion thereof is bound to component (A) and/or component (B) in the precursor solution. The conversion rate can be determined by a conventional analysis method, such as liquid chromatography (LC) or nuclear magnetic resonance spectroscopy (NMR).

The disilyl compound assists the siloxane compound represented by Formula (1), and contributes to the improvements in hydrophobicity and mechanical strength of the obtained porous material. Moreover, incorporation of the disilyl compound can further improve the storage stability of the composition.

The hydrolysis of the disilyl compound is preferably carried out in a similar manner to that carried out in the case of adding the cyclic siloxane compound. The addition amount of the disilyl compound may be appropriately selected according to the design performances or the like of the finally obtained porous material, but it is preferably from 0.1 to 100 mol %, more preferably from 0.5 to 50 mol %, further preferably from 1 to 30 mol %, and particularly preferably from 5 to 20 mol %, with respect to Si in the alkoxysilane compound (i.e., Si in component (A)).

The precursor solution obtained by the above process is subjected to aging at a temperature in the range of from 0 to 100° C., preferably from 20 to 70° C., for a period of from several minutes to 24 hours, preferably for 0.5 to 7 hours, whereby the composition according to the present invention is obtained.

One particularly preferred embodiment of the exemplary embodiment of the method for producing the composition according to the present invention as described above is a method at least including: a step of mixing an alkoxysilane compound, a catalyst and an organic solvent, at 20° C. to 70° C. for 0.5 hours to 7 hours; a step of adding a surfactant to the mixture obtained by the mixing; a step of concentrating the mixture to which the surfactant has been added until the mass of the mixture becomes 10% to 50%; a step of diluting the concentrated mixture with an organic solvent; a step of adding an element having an electronegativity of 2.5 or less to the diluted mixture; and a step of adding a siloxane compound represented by the following Formula (1) to the mixture to which the element has been added.

In the above-described embodiment, it is more preferred to further mixing the mixture at 20° C. to 70° C. for 0.5 hours to 7 hours, after the addition of the siloxane compound.

In the following, the above-described components are described in detail.

(Alkoxysilane Compound)

The composition according to the present invention contains a hydrolysate of the alkoxysilane compound (except for an alkoxysilane compound that corresponds to a siloxane compound represented by Formula (1)) as component (A).

The alkoxysilane compound forms a hydrolysate (component (A)) through hydrolyzation (and optionally through polycondensation).

The hydrolysate is a component that forms a main skeleton of the obtained porous material, and is preferably a dense inorganic polymer.

The alkoxysilane compound forms an inorganic polymer through polycondensation at a site of silanol group generated by hydrolyzation of an alkoxy group (an alkoxy group bound to a silicon atom). Therefore, in order to obtain component (A) as a dense inorganic polymer, it is preferred to use an alkoxysilane compound having two or more alkoxide groups in one molecule. Two or more alkoxy groups may be bound to one silicon atom. Further, the alkoxysilane compound may include two or more bonding units, each including one alkoxy group and one silicon atom bound to each other, in the same molecule.

Preferred alkoxysilane compounds of this type include at least one selected from the group consisting of a compound represented by the following Formula (i), a compound represented by the following Formula (ii), and a compound represented by the following Formula (iii).

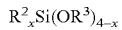
(i)

In Formula (i), each of $R^1$ may be the same or different from each other, and each represents —$C_aH_{2a+1}$ or a phenyl group, and a is an integer of 1 to 6.

$$R^2_xSi(OR^3)_{4-x}$$ (ii)

In Formula (ii), $R^2$ represents —$C_aH_{2a+1}$, a phenyl group, —$CF_3(CF_2)_b(CH_2)_c$, a hydrogen atom or a fluorine atom, each of $R^3$ may be the same or different from each other and represents —$C_aH_{2a+1}$ or a phenyl group, x is an integer of 0 to 3, a is an integer of 1 to 6, b is an integer of 0 to 10, and c is an integer of 0 to 4.

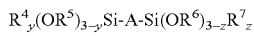
(iii)

In Formula (iii), each of y or z may be the same or different from each other and is an integer of 0 to 2, $R^4$ and $R^7$ may be the same or different from each other and represents —$C_aH_{2a+1}$, a phenyl group, —$CF_3(CF_2)_b(CH_2)_c$, a hydrogen atom or a fluorine atom. $R^5$ and $R^6$ may be the same or different from each other and represents —$C_aH_{2a+1}$ or a phenyl group, a is an integer of 1 to 6, b is an integer of 0 to 10, and c is an integer of 0 to 4. A represents an oxygen atom, —$(CH_2)_d$— or a phenylene group, and d is an integer of 1 to 6.

Specific examples of the alkoxysilane compound used in the present invention include quaternary alkoxysilanes such as tetramethoxysilane, tetraethoxysilane, tetraisopropoxysilane and tetrabutoxysilane; tertiary alkoxyfluorosilanes such as trimethoxyfluorosilane, triethoxyfluorosilane, triisopropoxyfluorosilane and tributoxyfluorosilane;

fluorine-containing alkoxysilanes such as $CF_3(CF_2)_3$ $CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2Si(OCH_3)_3$, $(CF_3)_2CF(CF_2)_4CH_2CH_2Si(OCH_3)_3$, $(CF_3)_2CF(CF_2)_6$ $CH_2CH_2Si(OCH_3)_3$, $(CF_3)_2CF(CF_2)_8CH_2CH_2Si(OCH_3)_3$, $CF_3(C_6H_4)CH_2CH_2Si(OCH_3)_3$, $CF_3(CF_2)_3(C_6H_4)$ $CH_2CH_2Si(OCH_3)_3$, $CF_3(CF_2)_5(C_6H_4)CH_2CH_2Si(OCH_3)_3$, $CF_3(CF_2)_7(C_6H_4)CH_2CH_2Si(OCH_3)_3$, $CF_3(CF_2)_3$ $CH_2CH_2$ $SiCH_3(OCH_3)_2$, $CF_3(CF_2)_5CH_2CH_2SiCH_3(OCH_3)_2$, $CF_3$ $(CF_2)_7CH_2CH_2SiCH_3(OCH_3)_2$, $CF_3(CF_2)_9CH_2CH_2SiCH_3$ $(OCH_3)_2$, $(CF_3)_2CF(CF_2)_4CH_2CH_2SiCH_3(OCH_3)_2$, $(CF_3)_2$ $CF(CF_2)_6CH_2CH_2SiCH_3(OCH_3)_2$, $(CF_3)_2CF(CF_2)_8$ $CH_2$ $CH_2SiCH_3(OCH_3)_2$, $CF_3(C_6H_4)CH_2CH_2SiCH_3(OCH_3)_2$, $CF_3(CF_2)_3(C_6H_4)CH_2CH_2SiCH_3(OCH_3)_2$, $CF_3(CF_2)_5$ $(C_6H_4)CH_2CH_2SiCH_3(OCH_3)_2$, $CF_3(CF_2)_7(C_6H_4)CH_2CH_2$ $SiCH_3(OCH_3)_2$, $CF_3(CF_2)_3CH_2CH_2Si(OCH_2CH_3)_3$, $CF_3$ $(CF_2)_5CH_2CH_2Si(OCH_2CH_3)_3$, $CF_3(CF_2)_7CH_2CH_2Si$ $(OCH_2CH_3)_3$ and $CF_3(CF_2)_9CH_2CH_2Si(OCH_2CH_3)_3$;

tertiary alkoxyalkylsilanes such as trimethoxymethylsilane, triethoxymethylsilane, trimethoxyethylsilane, triethoxyethylsilane, trimethoxypropylsilane and triethoxypropylsilane;

tertiary alkoxyarylsilanes such as trimethoxyphenylsilane, triethoxyphenylsilane, trimethoxychlorophenylsilane and triethoxychlorophenylsilane;

tertiary alkoxyphenethylsilanes such as trimethoxyphenethylsilane and triethoxyphenethylsilane;

secondary alkoxyalkylsilanes such as dimethoxydimethylsilane and diethoxydimethylsilane; and bis-alkoxysilanes such as 1,2-bis(trimethoxysilyl)ethane, 1,2-bis(triethoxysilyl)ethane, 1,2-bis(dimethylmethoxysilyl) ethane, 1,2-bis(dimethylethoxysilyl)ethane, 1,6-bis(trimethoxysilyl)hexane, 1,6-bis(triethoxysilyl)hexane, 1,6-bis (dimethylmethoxysilyl)hexane, 1,6-bis (dimethylethoxysilyl)hexane, 1,4-bis(trimethoxysilyl) benzene, 1,3-bis(trimethoxysilyl)benzene, 1,4-bis (triethoxysilyl)benzene and 1,3-bis(triethoxysilyl)benzene.

In the present invention, one or two or more kinds of the alkoxysilane compound selected from the above may be used.

(Organic Solvent)

Examples of the organic solvent which can be used in the present invention include monoalcohol-based solvents such as methanol, ethanol, n-propanol, i-propanol, n-butanol, butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzylalcohol, phenylmethylcarbinol, diacetone alcohol and cresol;

polyhydric alcohol-based solvents such as ethylene glycol, 1,2-propylene glycol, 1,3-butylene glycol, pentandiol-2,4,2-methylpentandiol-2,4, hexanediol-2,5, heptanediol-2,4,2-ethylhexanediol-1,3, diethylene glycol, dipropylene glycol, triethylene glycol, tripropylene glycol and glycerin;

ketone-based solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, 2-hexanone, methylcyclohexanone, 2,4-pentanedione, acetonylacetone, diacetone alcohol, acetophenone and fenchone;

ether-based solvents such as ethylether, i-propylether, n-butylether, n-hexylether, 2-ethylhexylether, ethylene oxide, 1,2-propylene oxide, dioxolane, 4-methyldioxolane, dioxane, dimethyldioxane, ethylene glycol monomethylether, ethylene glycol monoethylether, ethylene glycol diethylether, ethylene glycol mono-n-butylether, ethylene glycol mono-n-hexylether, ethylene glycol monophenylether, ethylene glycol mono-2-ethylbutylether, ethylene glycol dibutylether, diethylene glycol monomethylether, diethylene glycol monoethylether, diethylene glycol diethylether, diethylene glycol mono-n-butylether, diethylene glycol di-n-butylether, diethylene glycol mono-n-hexylether, ethoxytriglycol, tetraethylene glycol di-n-butylether, propylene glycol monomethylether, propylene glycol monoethylether, propylene glycol monopropylether, propylene glycol monobutylether, dipropylene glycol monomethylether, dipropylene glycol monoethylether, tripropylene glycol monomethylether, tetrahydrofuran and 2-methyltetrahydrofuran;

ester-based solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate and diethyl phthalate; and nitrogen-containing solvents such as N-methylformamide, N,N-dimethylformamide, N,N-diethylformamide, acetamide, N-methylacetamide, N,N-dimethylacetamide, N-methylpropionamide and N-methylpyrrolidone.

In the present invention, one or two or more kinds of the organic selected from the above may be used.

(Catalyst)

In the present invention, the catalyst that can be used in the precursor composition solution may be, for example, at least one kind of acid catalyst or alkali catalyst.

Examples of the acid catalyst include inorganic acids and organic acids.

Examples of the inorganic acid include hydrochloric acid, nitric acid, sulfuric acid, hydrofluoric acid, phosphoric acid, boric acid and hydrobromic acid.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluensulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid and malic acid.

Examples of the alkali catalyst include ammonium salts and nitrogen-containing compounds.

Examples of the ammonium salt include tetramethylammonium hydroxide, tetraethylammonium hydroxide, tetrapropylammonium hydroxide and tetrabutylammonium hydroxide.

Examples of the nitrogen-containing compound include pyridine, pyrrole, piperidine, 1-methylpiperidine, 2-methylpiperidine, 3-methylpiperidine, 4-methylpiperidine, piperazine, 1-methylpiperazine, 2-methylpiperazine, 1,4-dimethylpiperazine, pyrrolidine, 1-methylpyrrolidine, picoline, monoethanolamine, diethanolamine, dimethylmonoethanolamine, monomethyldiethanolamine, triethanolamine, diazabicyclooctane, diazabicyclononane, diazabicycloundecene, 2-pyrazoline, 3-pyrroline, quinuclidine, ammonia, methylamine, ethylamine, propylamine, butylamine, N,N-dimethylamine, N,N-diethylamine, N,N-dipropylamine, N,N-dibutylamine, trimethylamine, triethylamine, tripropylamine and tributylamine.

Further, all kinds of acid compounds and alkali compounds including element (D) may be used as the catalyst.

It is also preferred to select a compound that thermally decomposes at a temperature in the range of from 90 to 200° C. (hereinafter, also referred to as "specific thermally decomposable compound") as the catalyst.

The specific thermally decomposable compound does not act as a catalyst at the time of adding the same, but acts as a catalyst after applying the same to a support and elevating the temperature.

The pH of the composition after the addition of the specific thermally decomposable compound is preferably from 6.5 to 8. If the pH is less than 6.5, indicating that the composition is acidic, the compound may promote the hydrolysis due to its electrophilic reaction as a catalyst. If the pH exceeds 8, gelation may be caused as a result of hydrolysis which is promoted by the electrophilic reaction at the same time as the addition of the compound, whereby problems may be caused when a porous material is used in a semiconductor.

The specific thermally decomposable compound is preferably an organic compound including at least one of a urea bond, a urethane bond or an amide bond in the molecule thereof.

The organic compound including a urea bond is preferably at least one of the urea compound represented by the following Formula (v).

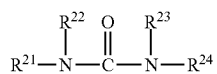

In Formula (v), $R^{21}$, $R^{22}$, $R^{23}$ and $R^{24}$ may be the same or different from each other, and each represent a hydrogen atom, a phenyl group or —$C_aH_{2a+1}$, and a is an integer of 1 to 3.

Specific examples of the urea compound represented by Formula (v) include urea, methylurea, 1,1-dimethylurea, 1,3-dimethylurea and ethylurea. Among these, urea is particularly preferred.

The compound having a urethane bond is preferably at least one kind of the urethane compound represented by the following Formula (vi).

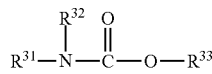

In Formula (vi), $R^{31}$, $R^{32}$ and $R^{33}$ may be the same or different from each other, and each represent a hydrogen atom, a phenyl group or —$C_aH_{2a+1}$, and a is an integer of 1 to 3.

Specific examples of the urethane compound represented by Formula (vi) include methyl carbamate and ethyl carbamate.

The compound including an amide bond is preferably at least one kind of the amide compound represented by the following Formula (vii).

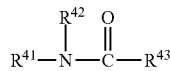

In Formula (vii), $R^{41}$, $R^{42}$ and $R^{43}$ may be the same or different from each other, and each represent a hydrogen atom, a phenyl group or —$C_aH_{2a}+_1$, and a is an integer of 1 to 3.

Specific examples of the amide compound represented by Formula (vii) include acetamide, N-methylformamide and N,N-dimethylformamide.

In the present invention, at least one selected from the group consisting of the urea compound represented by Formula (v), the urethane compound represented by Formula (vi), and the amide compound represented by Formula (vii) may be used as the specific thermally decomposable compound. Among these, the urea compound represented by Formula (v) is preferred.

(Surfactant (C))

The composition of the present invention contains surfactant (C).

The surfactant is not particularly limited, but, for example, a surfactant having a molecular weight of from 200 to 5000 is preferred. When the molecular weight is small, a sufficient amount of voids may not be formed, and the dielectric constant of the film may not be lowered. When the molecular weight is large, the size of the formed voids may be too large, and the mechanical strength of the obtained film may be lowered.

Preferred examples of the surfactant include the following.

(I) Compound Having Long-Chain Alkyl Group and Hydrophilic Group

The long-chain alkyl group that may be used herein preferably has 8 to 24 carbon atoms, more preferably 12 to 18 carbon atoms. Examples of the hydrophilic group include a quaternary ammonium salt, an amino group, a nitroso group, a hydroxy group and a carboxylic group. Among these, a quaternary ammonium salt or a hydroxy group is preferable.

Specifically, an alkylammonium salt represented by the following Formula (x) is preferred as the surfactant.

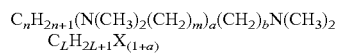

In Formula (x), a is an integer of 0 to 2, b is an integer of 0 to 4, n is an integer of 8 to 24, m is an integer of 0 to 12, L is an integer of 1 to 24, and X represents a hydroxide ion, a halide ion, $HSO_4^-$ or a monovalent organic anion.

If a, b, n, m and L are within the above-described ranges and X is the above-described ion, voids having an appropriate size are formed and a target compound sufficiently penetrates into the voids during a gas-phase reaction after the formation of the voids, thereby facilitating the occurance of desired polymerization reaction.

(II) Compound Having Polyalkylene Oxide Structure

Examples of the polyalkylene oxide structure include a polyethylene oxide structure, a polypropylene oxide structure, a polytetramethylene oxide structure and a polybutylene oxide structure.

Specific examples of the compound having a polyalkylene oxide structure include a polyoxyethylene-polyoxypropylene block copolymer, a polyoxyethylene-polyoxybutylene block copolymer; ether-type compounds such as a polyoxyethylene-polyoxypropylene alkyl ether, a polyoxyethylene alkyl ether and a polyoxyethylene alkyl phenyl ether; and ether ester-type compounds such as a polyoxyethylene glycerin fatty acid ester, a polyoxyethylene sorbitan fatty acid ester, a polyoxyethylene sorbitol fatty acid ester, a sorbitan fatty acid ester, a propylene glycol fatty acid ester and a sucrose fatty acid ester.

In the present invention, one or two or more kinds of the surfactant may be selected from the above.

(Element Having Electronegativity of 2.5 or Less (D))

The composition of the present invention contains (D) element having an electronegativity of 2.5 or less (element (D)).

As mentioned above, element (D) used in the present invention exhibits an effect of increasing the reactivity between component (A) and component (B), thereby enhancing the hydrophobicity and the mechanical strength of the finally obtained porous material.

The specific mechanism of this effect is not clear, but it is presumed that the organic functional group in component (B) is removed by element (D) and a reaction active site is formed, and as a result, component (B) efficiently binds to component (A), thereby forming a dense inorganic polymer.

In order to attain this effect, it is believed to be important that element (D) is an element having a reversible bonding state with respect to an element in the composition such as Si, O or C. In order to have an appropriate interaction of this kind, an element having a different Pauling electronegativity from that of Si, O or C is preferred. Specifically, an element having an electronegativity that is lower than 3.5, i.e., the electronegativity of O, is preferred; an element having an electronegativity that is lower than 2.5, i.e., the electronegativity of C, is more preferred; and an element having an electronegativity that is lower than 1.8, i.e., the electronegativity of Si, is further preferred.

Further, at this time, the metallic element contained in the porous film needs to have a property of remaining stable in the film, even if stress of any kind, especially electrical stress, is applied. Moreover, the metallic element needs to have a property of not adversely affecting other components than the porous material (porous film) in the object in which the porous material is used, such as a semiconductor device. An ordinary metallic element is not preferred as the element to be included in the porous material, since it may adversely affect the performance of the semiconductor itself.

However, amphoteric elements such as Al, Zn, Sn and Pb, which are metallic but do not adversly affect a semiconductor, which are already used in some semiconductor devices, may be within the scope of the present invention.

Further, element (D) is preferably an element having an ionic radius of 1.6 angstroms or more, which is hard to migrate in the porous film even if a certain level of electrical stress is applied.

In addition, element (D) is preferably an element having an atomic weight of 130 or more. More specifically, heavy elements classified into the $6^{th}$ period in Periodic Table (elements having an atomic number of 55 or more) are preferred.

Representative examples of element (D) which fulfill the foregoing requirements and are applicable to the present invention include B, Al, P, Zn, Ga, Ge, As, Se, In, Sn, Sb, Te, Rb, Cs, Ba, La, Hf, Ta, W, Re, Os, Ir, Pt, Au, Hg, Tl, Pb, Bi, Po, At and a lanthanoid. Among these, component (D) is preferably at least one element selected from the group consisting of Cs, Ba, lanthanoids, Hf, P, Pb, Bi, Po, Se, Te, As, Rb, Al and Sn. The composition according to the present invention includes at least one of these elements.

The method for introducing element (D) is not particularly limited, and may be either a method of introducing element (D) itself or a method of introducing a compound including element (D).

The compound including element (D) is not particularly limited, and examples thereof include a nitrate compound, an oxide compound, an organo-metallic compound and a basic compound. Other known compounds including components (D) according to the present invention are also applicable.

Element (D) can be introduced using these compounds. At this time, element (D) is preferably introduced as a mixture of these compounds and water or an organic solvent such as an alcohol.

(Siloxane Compound Represented by Formula (1))

The composition according to the present invention contains a hydrolysate of the siloxane compound represented by the following Formula (1), as component (B).

In Formula (1), $R^A$ and $R^B$ each independently represent a hydrogen atom, a phenyl group, $-C_aH_{2a+1}$, $-(CH_2)_b(CF_2)_cCF_3$ or $-C_dH_{2d-1}$, and $R^A$ and $R^B$ are both hydrogen atoms simultaneously.

In Formula (1), $R^C$ and $R^D$ represent a single bond that links a silicon atom and an oxygen atom to form a cyclic siloxane structure, or each independently represent a hydrogen atom, a phenyl group, $-C_aH_{2a+1}$, $-(CH_2)_b(CF_2)_cCF_3$ or $-C_dH_{2d-1}$.

In Formula (1), a represents an integer of 1 to 6 (preferably 1 to 3), b represents an integer of 0 to 4, c represents an integer of 0 to 10, d represents an integer of 2 to 4, and n represents an integer of 3 or greater.

By further including a hydrolysate of a siloxane compound represented by Formula (1) in the composition according to the present invention, in addition to component (A) and element (D), the obtained porous material formed from the composition can be hydrophobized (i.e., the relative dielectric constant k can be lowered) and the strength of the porous material can be enhanced. Moreover, the storage stability of the composition can be improved.

The porous material formed from the composition according to the present invention, which includes a hydrolysate of a siloxane compound represented by Formula (1), component (A), element (D) and surfactant (C), may exhibit remarkably improved hydrophobicity, especially when the porous material is formed by irradiating the coated film formed from the composition with ultraviolet (UV) rays in order to remove at least part of the surfactant.

The following are assumed reasons as to how the above effect is achieved, with reference to the comparison between a siloxane compound represented by Formula (1) and a disilyl compound such as hexamethyldisiloxane. However, the present invention is not limited to these reasons.

The siloxane compound represented by Formula (1) includes Si that has two functional groups each containing no silicon atom (Si) (i.e., Si having $R^A$ and $R^B$).

In the present invention, Si having two functional groups each containing no Si may be referred to as "difunctional silicon atom (Si)" in some cases, and Si having three functional groups each containing no silicon atom (Si) may be referred to as "trifunctional silicon atom (Si)" in some cases.

For example, if n is 3 and $R^D$ and $R^D$ are not a single bond in Formula (1), the silicon atom at the center of the main chain composed of three repeating units of Si—O is a difunctional silicon atom, while the two silicon atoms at the ends of the main chain are trifunctional silicon atoms. Further, in Formula (1), at least one of the two functional groups bound to the difunctional Si ($R^A$ and $R^B$) is a hydrophobic group (a phenyl group, $-C_aH_{2a+1}$, $-(CH_2)_b(CF_2)_cCF_3$ or $-C_dH_{2d-1}$).

On the other hand, a disilyl compound such as hexamethyldisiloxane has two trifunctional silicon atoms, but has no difunctional silicon atom.

Further, in the hexamethyldisiloxane, all of the three functional groups bound to the trifunctional silicon atom are methyl groups (hydrophobic groups).

From the result of studies using FT-IR, the present inventors have found that a hydrophobic group substituting the difunctional Si has a higher UV resistance than that of a hydrophobic group substituting the trifunctional Si (i.e., less likely to be free upon UV irradiation).

Accordingly, by forming a porous material by irradiating the composition according to the present invention containing a hydrolysate of a siloxane compound represented by Formula (1) with UV rays, more hydrophobic groups can remain in the porous material as compared with the case in which a

hydrolysate of a disilyl compound is used instead of a hydrolysate of a siloxane compound represented by Formula (1). As a result, it is assumed that the hydrophobicity of the porous material can be remarkably improved.

It should be noted, however, that the above description does not indicate that the hydrophobicity of the porous material is weakened by adding a hydrolysate of a disilyl compound to component (A).

Specifically, as explained later, the hydrophobicity and the mechanical strength of the porous material can be even more improved by using a hydrolysate of a siloxane compound represented by Formula (1) and a hydrolysate of a disilyl compound in combination, as compared with the case in which only a hydrolysate of a siloxane compound represented by Formula (1) is used.

The hydrolysate of a siloxane compound represented by Formula (1) also has, as described above, a function of improving the strength of the porous material by binding to component (A) in the presence of element (D), in addition to the function of improving the hydrophobicity of the porous material.

Moreover, the hydrolysate of a siloxane compound represented by Formula (1) also has a function of improving the storage stability of the composition.

From the viewpoint of attaining hydrophobicity (lower relative dielectric constant) by performing UV irradiation, in Formula (1), $R^A$ and $R^B$ are preferably a hydrogen atom, a phenyl group, $—C_aH_{2a+1}$ (a is an integer of 1 to 6) or $—(CH_2)_b(CF_2)_cCF_3$, more preferably a hydrogen atom or $—C_aH_{2a+1}$ (a is an integer of 1 to 6), further preferably a hydrogen atom or $—C_aH_{2a+1}$ (a is an integer of 1 to 3), and particularly preferably one of $R^A$ and $R^B$ is a hydrogen atom and the other is $—C_aH_{2a+1}$ (a is an integer of 1 to 3).

Further, from the viewpoint of attaining hydrophobicity (lower relative dielectric constant) and improving the mechanical strength, $R^C$ and the $R^D$ are preferably a single bond that links a silicon atom and an oxygen atom to form a cyclic siloxane structure (i.e., the siloxane compound represented by Formula (1) is a cyclic siloxane compound).

Further, from the viewpoint of the effects of the present invention, n in Formula (1) is more preferably an integer of 3 to 8.

—Cyclic Siloxane Compound—

The cyclic siloxane compound is preferably a compound having at least one hydrophobic group selected from an alkyl group having 1 to 6 (preferably 1 to 3) carbon atoms or a phenyl group, at least one hydrogen atom, and at least one functional group selected from a hydroxy group or a halogen atom. Examples of the alkyl group include a methyl group, an ethyl group, a propyl group and a butyl group. The alkyl group may have a chain or branched structure, and the hydrogen atom thereof may be substituted by a fluorine atom or the like. The halogen atom is selected from fluorine, chlorine, bromine and iodine.

The cyclic siloxane compound is preferably a compound represented by the following Formula (2).

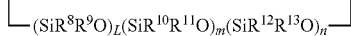

(2)

In Formula (2), $R^8$, $R^9$, $R^{10}$, $R^{11}$, $R^{12}$ and $R^{13}$ each independently represent a hydrogen atom, a phenyl group, $—C_aH_{2a+1}$, $—(CH_2)_b(CF_2)_cCF_3$ or $—C_dH_{2d-1}$, but $R^8$ and $R^9$ are both not hydrogen atoms simultaneously, $R^{10}$ and $R^{11}$ are both not hydrogen atoms simultaneously, and $R^{12}$ and $R^{13}$ both not hydrogen atoms simultaneously.

a represents an integer of 1 to 3, b represents an integer of 0 to 4, c represents an integer of 0 to 10, and d represents an integer of 2 to 4.

In Formula (2), L represents an integer of 0 to 8, m represents an integer of 0 to 8, n represents an integer of 0 to 8, and L, M and n satisfy the relationship 3≤L+m+n≤8.

From the viewpoint of attaining hydrophobicity (low relative dielectric constant) by performing irradiation with ultraviolet rays, $R^8$, $R^9$, $R^{10}$, $R^{11}$, $R^{12}$ and $R^{13}$ are preferably a hydrogen atom, a phenyl group, $—C_aH_{2a+1}$ (a is an integer of 1 to 6) or $—(CH_2)_b(CF_2)_cCF_3$, more preferably a hydrogen atom or $—C_aH_{2a+1}$ (a is an integer of 1 to 6), further preferably a hydrogen atom or $—C_aH_{2a+1}$ (a is an integer of 1 to 3), and particularly preferably either one is a hydrogen atom while the other is $—C_aH_{2a+1}$ (a is an integer of 1 to 3).

Specific examples of the cyclic siloxane compound include tri(3,3,3-trifluoropropyl)trimethylcyclotrisiloxane, triphenyltrimethylcyclotrisiloxane, octamethylcyclotetrasiloxane, 1,3,5,7-teteramethyl-1,3,5,7-teteraphenylcycloteterasiloxane, 1,2,3,4,5,6-hexamethylcyclotrisiloxane, 1,3,5,7-teteraethyl-2,4,6,8-tetramethylcyclotetrasiloxane, 1,2,3-triethyl-2,4,6-triethylcyclotrisiloxane, 1,3,5,7-tetramethylcyclotetrasiloxane, 1,3,5,7-tetraethylcycloteterasiloxane, 1,3,5,7-teteraphenylcyclotetrasiloxane and pentamethylcyclopentasiloxane.

The cyclic siloxane compounds which can be used in the present invention may be used alone or in combination of two or more kinds thereof. Among these cyclic siloxanes, 1,3,5,7-tetramethylcyclotetrasiloxane is particularly preferred.

(Disilyl Compound)

The composition of the present invention preferably contains a hydrolysate of a disilyl compound.

Here, the disilyl compound is a component that assists the siloxane compound represented by Formula (1), and when used in combination with the siloxane compound represented by Formula (1), the disilyl compound contributes to the improvements in hydrophobicity and strength of the obtained film, as well as exerts an effect of increasing the storage stability of the composition.

The reason for this is presumed to be as follows. Specifically, when the disilyl compound is added, unreacted silanol groups that are present in the inorganic polymer having $SiO_2$ as a main skeleton (including component (A) and component (B)) are capped with a hydrophobic silyl group. Therefore, it is thought that the effects of adding the disilyl compound include an effect of improving the mechanical strength through "Spring-Back effect" (J. Electrochem. Soc. G, 2003, vol. 150, p. F123), which is due to the binding of a hydrophobic silyl group film surface that is larger than the silanol group, in addition to the effect of improving the hydrophobicity by the hydrophobic silyl group. Further, since the capping of a terminal silanol group of the inorganic polymer also inhibits excessive polymerization of the inorganic polymer in the composition, it is thought that the effects of adding the disilyl compound also include an effect of improving the storage stability of the composition.

If the composition according to the present invention contains a disilyl compound, the composition can remarkably improve the mechanical strength of the obtained porous material, especially when the porous material is formed by irradiating the coated film formed from the composition with ultraviolet (UV) rays in order to remove at least part of the surfactant.

The reason for this effect is presumed to be as follows, but the present invention is not limited thereto.

Specifically, as mentioned above, the hydrophobic group substituting the trifunctional Si in the disilyl compound is more likely to be free by UV irradiation, for example, as compared with the hydrophobic group substituting the difunctional Si in the siloxane compound represented by Formula (1). Therefore, by performing UV irradiation, the disilyl compound loses at least part of the hydrophobic groups, and thus enters a highly reactive state. Accordingly, it is thought that the disilyl compound which has lost at least part of the hydrophobic groups is introduced into the skeleton formed from component (A) and component (B), thereby further improving the mechanical strength of the skeleton.

As mentioned above, when the composition according to the present invention includes a disilyl compound, the siloxane compound represented by Formula (1) particularly improves the hydrophobicity, while the disilyl compound particularly improves the mechanical strength, in the system in which a coated film formed from the composition is irradiated with ultraviolet (UV) rays.

The disilyl compound is preferably a disilyl compound represented by the following Formula (3).

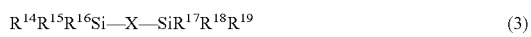

$$R^{14}R^{15}R^{16}Si-X-SiR^{17}R^{18}R^{19} \quad (3)$$

In Formula (3), $R^{14}$, $R^{15}$, $R^{16}$, $R^{17}$, $R^{18}$ and $R^{19}$ each independently represent a hydrogen atom, a phenyl group, $-C_aH_{2a+1}$ or $-(CH_2)_b(CF_2)_cCF_3$, a represents an integer of 1 to 3, b represents an integer of 0 to 4, and c represents an integer of 0 to 10.

X represents an oxygen atom or $>NR^{20}$, $R^{20}$ represents a hydrogen atom or $-C_eH_{2e+1}$, and e represents an integer of 1 to 3.

Specific examples of the disilyl compound represented by Formula (3) include hexamethyl disilazane, hexaethyl disilazane, hexaphenyldisilazane, hexamethyl disiloxane, hexaethyl disiloxane and hexaphenyl disiloxane. The disilyl compounds which can be used in the present invention may be used alone or in combination of two or more kinds thereof. Among these disilyl compounds, hexamethyl disiloxane is preferred.

Further, the disilyl compound represented by Formula (3) may be used in combination with a further silyl compound. Examples of the further silyl compound include trimethylsilyl chloride, triethylsilyl chloride, trimethylsilyl dimethylamine, trimethylsilyl diethylamine and trimethylsilyl diphenylamine.

<(b) Step of Forming Film of Porous Material>

The porous material of the present invention can be obtained by applying the composition of the present invention onto a support to form a composition layer, subjecting the formed composition layer to a heat treatment, and irradiating the heat-treated composition layer with ultraviolet rays. Further, the obtained film may be subjected to silylation using a silylating agent.

The support is not particularly limited, and examples thereof include glass, quartz, a silicon wafer, stainless steel and plastics. The shape of the support is not particularly limited, and may be any one of a plate shape, a dish shape, or the like.

The method for applying the composition onto the support is not particularly limited, and examples thereof include typical methods such as a spin coating method, a casting method, a dip coating method, and the like. For example, in the case of the spin coating method, the support is placed on a spinner and the coating liquid is dropped on the support while rotating the same at a rate of from 100 to 10000 rpm. By performing the coating, a precursor material (composition layer), which is a silica sol containing component (A), component (B), surfactant (C) and element (D), is formed on the support.

The obtained composition layer is subjected to a heat treatment in the next step.

The heating temperature at the heat treatment is preferably from 80° C. to 400° C.

The heat treatment as mentioned herein encompasses a heat treatment performed at a temperature of lower than 200° C. in order to remove volatile components such as organic solvent or water (low-temperature heat treatment); and a heat treatment performed at a temperature of 200° C. or higher in order to remove the surfactant, which has been added for the formation of voids, by thermal decomposition (high-temperature heat treatment).

Since the precursor material immediately after the application is in a state in which the organic solvent or water is adsorbed in the precursor material, it is preferred to remove the volatile components by performing a low-temperature heat treatment.

The temperature for the low-temperature heat treatment is from 80 to 200° C., preferably from 100 to 150° C. When the temperature is within this range, volatile components such as an organic solvent or water can be removed while not causing problems such as swelling or peeling of the film. The low-temperature heat treatment may be sufficient if it is conducted for at least 1 minute, but the curing rate may be extremely lowered when the time exceeds a certain degree. Therefore, in view of efficiency, the time for the low-temperature heat treatment is preferably from 1 to 60 minutes.

The method for heating the silica sol is not particularly limited, and any known methods for heating a sol may be employed.

Next, the high-temperature heat treatment is carried out.

The higher the heating temperature at the high-temperature heat treatment is, the easier the decomposition of the surfactant is to occur. However, in view of the problems during the semiconductor processing, the temperature is preferably 400° C. or lower, more preferably 350° C. or lower. Further, the temperature is preferably 200° C. or higher, more preferably 300° C. or higher, further in view of the processing time. The high-temperature heating may be carried out under any heating atmosphere such as nitrogen, oxygen, hydrogen or air, without being particularly limited. However, the high-temperature heating is preferably carried out under a non-oxygen atmosphere, since if the heating is carried out during the semiconductor processing, wiring resistance may be increased by the oxidation of Cu wiring. The non-oxidating atmosphere as mentioned herein refers to an atmosphere in which the oxygen concentration at the time of performing sintering (high-temperature heating) is 50 ppm or less.

In view of the aforementioned, the heat treatment in the present invention is particularly preferably carried out by subjecting the composition layer to a heat treatment at 80° C. to 200° C., and subsequently to a heat treatment at 300° C. to 400° C.

In the present invention, it is particularly important to perform ultraviolet ray irradiation to the composition layer that has been subjected to the heat treatment, in view of forming a porous material that exhibits a low dielectric constant and a high mechanical strength.

After conducting extensive studies on the effects of ultraviolet ray irradiation, it was surprisingly found out that the relative dielectric constant can be further lowered and the mechanical strength can be further improved when irradiation is performed with ultraviolet rays within a specific range.

Specifically, when irradiation is conducted with ultraviolet rays within a specific range, in the composition layer, either one of the two functional groups bound to the difunctional silicon atom (Si) in component (B) (i.e., either one of $R^A$ and $R^B$ in Formula (1)) becomes free from Si prior to the other functional group. At this time, as mentioned above, the hydrophobic group bound to the difunctional Si is relatively less likely to be free. Therefore, for example, when either one of $R^A$ and $R^B$ is a hydrogen atom and the other is a hydrophobic group, the hydrogen atom preferentially becomes free from Si while the hydrophobic group remains at Si.

Further, it was found out that the site at which the functional group of Si had been eliminated was brought into reaction with a silanol group present on the skeleton of the composition layer, whereby the hydrophilic silanol group was removed from the skeleton of the composition layer.

Moreover, as long as the composition layer is irradiated with ultraviolet rays within the above range, it was found out that the hydrophobic group remaining on Si (i.e., either one of $R^A$ and $R^B$ in Formula (1)) was maintained without becoming free, and as a result, a certain amount of hydrophobic groups that was sufficient to exhibit hydrophobicity remained in the porous material.

In view of the above, it is thought that component (B) functions as a reinforcing agent by binding to the skeleton of the composition layer, while removing the silanol group that forms an adsorption point for water and maintaining hydrophobic groups in an amount that is necessary to attain hydrophobicity. As a result, it is thought that a porous material having a low dielectric constant and a high mechanical strength is formed.

Preferred conditions for the ultraviolet ray treatment in order to obtain the above-described porous material include the following.

For example, the wavelength of the ultraviolet rays is preferably from 10 to 400 nm, more preferably from 150 to 250 nm. When the wavelength is within this range, the ultraviolet rays have energy that is sufficient to separate the functional group in component (B) from the silicon atom. The intensity of ultraviolet rays has an influence on the time for separation of a functional group or the like, and the higher the intensity of ultraviolet rays is, the shorter the time for separation can be. Therefore, the intensity is preferably from 1 to 50 mW/cm², more preferably from 5 to 20 mW/cm². When the intensity is within this range, the intensity is not too small to fail to separate the functional group in component (B) from the silicon atom, or not too large to separate all functional groups in component (B), thereby deteriorating the hydrophobicity of the obtained porous material.

The temperature for the ultraviolet ray irradiation is preferably from 10 to 400° C., more preferably from 150 to 350° C., particularly preferably from 200 to 350° C. The irradiation is preferably carried out at high temperature, since the reaction rate can be increased in terms of separation of the functional group from the silicon atom, and the reaction between the site from which the functional group is separated and the silanol. The time for the ultraviolet ray irradiation is not particularly limited, but is preferably carried out within 20 minutes, more preferably within 10 minutes, from the economic viewpoint. Further, the irradiation is preferably carried out at a pressure in the range of from 0.01 to 101.3 kPa. The ultraviolet ray irradiation is preferably carried out under a non-oxidizing atmosphere. When oxygen is present at the time of performing ultraviolet ray irradiation, ozone is generated by the ultraviolet rays and the hydrophobic groups in the film are oxidized, thereby reducing the amount of the hydrophobic groups. Accordingly, the oxygen concentration is preferably controlled to 10 ppm or less.

Further, in the present invention, the composition layer (porous material) after being subjected to the ultraviolet ray irradiation may be further subjected to a silylation treatment using a silylating agent. The silylation treatment can be carried out by a known method without being particularly limited.

The silylating agent is not particularly limited, and examples thereof include the siloxane compound represented by Formula (2), the disilyl compound represented by Formula (3), and other silyl compounds.

As explained above, in order to obtain a porous material having a low dielectric constant and an excellent mechanical strength, it is important to form a film from a composition containing component (A) that forms a main skeleton; surfactant (C) that contributes to the formation of voids; component (B) that reinforces the main skeleton; and element (D) that enhances the reactivity between component (A) and component (B), and then irradiating the film with ultraviolet rays. In addition, a favorable porous material that exhibits excellent characteristics may also be obtained by adding component (E) to the composition.

<Porous Material>

The porous material according to the present invention is prepared by the production method as explained above.

The density of the porous material according to the present invention is preferably from 0.5 g/cm³ to 2.0 g/cm³, more preferably from 0.7 g/cm³ to 1.2 g/cm³, from the viewpoint of lowering the relative dielectric constant and improving the mechanical strength at the same time.

The density described herein refers to a value as measured by an ordinary method using an XRD device (TPR-In-Plane, Rigaku Co.) with an X-ray source of 50 kV, 300 mA, at a wavelength of 1.5418 angstroms, within a scanning range of 0 to 1.5°.

Further, from the viewpoint of lowering the relative dielectric constant and improving the mechanical strength, the porous material according to the present invention preferably satisfies, in the range of a wavenumber of an infrared ray absorption spectrum of from 1800 cm⁻¹ to 4800 cm⁻¹, (I) having one clear absorption peak derived from a C—H stretching movement of an alkyl group (hereinafter, also referred to as "peak (I)"); (II) showing an intensity I (II) of an absorption peak derived from an Si—O stretching movement of an SiOH group (hereinafter, also referred to as "peak (II)") being not more than 0.30 times as much as the intensity I (I) of the absorption peak derived from the C—H stretching movement of an alkyl group; and (III) having one clear absorption peak derived from an Si—H stretching movement of an HSiO₃ group (hereinafter, also referred to as "peak (III)"), the wavenumber thereof being less than 2300 cm⁻¹ and the intensity I (III) thereof being from 0.5 times to 3.0 times as much as the absorption peak intensity derived from the C—H stretching movement of an alkyl group.

In the present invention, the infrared ray absorption spectrum refers to a Fourier Transform Infrared Absorption Spectrum (FT-IR spectrum).

The presence of peak (I) indicates the presence of an alkyl group, which is a hydrophobic group, in the porous material. Accordingly, the absence of peak (I) indicates that the porous material is not hydrophobized. If the alkyl group is a methyl group, peak (I) is seen at a wavenumber of around 2900 cm⁻¹ to 3100 cm⁻¹.

Peak (II) refers to a peak derived from an Si—OH group, and is specifically seen at around 3600 cm⁻¹ to 3800 cm⁻¹.

The intensity of peak (II) is preferably not more than 0.30 of the the intensity of peak (I), i.e., the intensity ratio (I (II)/I (I)) is preferably not more than 0.30.

Specifically, it is preferred that the height of peak (II) with respect to the baseline in the range of from 3300 cm$^{-1}$ to 3800 cm$^{-1}$ is not more than 0.30 times as high as the height of the absorption peak derived from an alkyl group.

Since the Si—OH group is highly reactive and particularly likely to adsorb water molecules thereto, the amount of Si—OH groups in the porous material is preferably smaller. Accordingly, it is particularly preferred not to have peak (II) in the infrared ray absorption spectrum.

Peak (III) refers to a peak derived from an HSiO$_3$ group.

The wavenumber of peak (III) is preferably less than 2300 cm$^{-1}$. In that case, the film strength of the porous material is further increased.

Further, peak (III) preferably has an intensity of from 0.5 times to 3 times as much as that of peak (I), i.e., the ratio (I (III)/I (I)) is preferably from 0.5 to 3. If the intensity is less than 0.5 times as much as the intensity of peak (I), the silica skeleton may not be sufficiently strengthened. Further, if the intensity is less than 0.5 times as much as the intensity of peak (I), it may be suspected that the surfactant is not completely removed and still remains, thereby causing increase in the intensity of peak (I). Meanwhile, if the intensity of the peak derived from a HSiO$_3$ group is too large, the number of the alkyl groups may be insufficient (i.e. the degree of hydrophobization may be insufficient).

Further, the porous material according to the present invention may have (IV) an absorption peak derived from an Si—H stretching movement of a H(CH$_3$)SiO$_2$ group (hereinafter, also referred to as "peak (IV)") at the lower wavenumber-side of peak (III) (for example, at a wavenumber of around 2100 cm$^{-1}$ to 2200 cm$^{-1}$) in its infrared ray absorption spectrum. Hereinafter, the intensity of peak (IV) is referred to as "I (IV)".

The intensity ratio (I (IV)/I (III)) is preferably from 0.05 to 0.50, more preferably from 0.07 to 0.40.

When the intensity ratio is 0.50 or less, it indicates that the reaction between component (A) and component (B) is more effectively achieved.

Since the porous material according to the present invention as described above exhibits excellent dielectric constant and hydrophobicity, as well as excellent mechanical strength, it is applicable to semiconductor materials such as an interlayer insulating film and an interwiring insulating film; and optical functional materials or electronic functional materials such as a molecule recording medium, a transparent conductive film, a solid electrolyte, an optical waveguide and a color member for LCD. In particular, in view of the requirements for an interlayer insulating film and an interwiring insulating film that are formed from a semiconductor material, including a low dielectric constant, hydrophobicity and a high mechanical strength, the porous material according to the present invention is suitable for these applications in view of its excellent properties such as a low dielectric constant, hydrophobicity and a high mechanical strength.

The following are details of exemplary methods of producing a semiconductor device in which the porous material according to the present invention is used as an interlayer insulating film or as an interwiring insulating film. The production may be carried out in accordance with the conditions for a known production process of a semiconductor device.

First, as described above, a porous material (porous film) is formed on a surface of a support. According to the method for producing the porous material according to the present invention, it is possible to obtain an interlayer insulating film or an interwiring insulating film that exhibits excellent dielectric constant and hydrophobicity, as well as a high mechanical strength. Subsequently, a hard mask and a photoresist are formed on the porous film according to known preparation process conditions, and etching is performed in accordance with the pattern of the photoresist. After the etching, a barrier film composed of titanium nitride (TiN) or tantalum nitride (TaN) is formed on the porous film surface by a vapor-phase growth technique (CVD).

After forming the barrier film on the surface of the porous film according to the present invention, copper wiring is formed thereon by a metal CVD method, a sputtering method or an electrolytic plating method, in accordance with known preparation process conditions. Thereafter, the film is smoothed by performing CMP. Subsequently, a cap film is formed on the surface of the film. As necessary, a hard mask is formed and the above steps are repeated in order to form a multilayer structure, thereby preparing the semiconductor device according to the present invention.

In the foregoing, embodiments in which the composition or the porous material according to the present invention is used as a semiconductor material, such as an interlayer insulating film or an interwiring insulating film in an semiconductor circuit element (semiconductor device), are explained. However, applications of the composition and the porous material according to the present invention are not limited to these applications.

For example, the composition and the porous material according to the present invention may be suitably used in various applications, including those that need to be subjected to a surface treatment in an aqueous solution, such as waterproofing films, electric materials, catalytic materials and filter materials.

Further, since the porous material according to the present invention exhibits a low relative dielectric constant, it also has a low refractive index. Therefore, the porous material according to the present invention may be suitably used as a low-refractive-index surface protection film.

The low-refractive-index surface protection film refers to a surface protection film used in applications in which the transmittance needs to be improved by suppressing surface reflection.

Examples of the low-refractive-index surface protection film include an anti-reflection film, a film for a light-emitting device, a hard coat film, and a polarizer protection film.

The low-refractive index as mentioned herein refers to a refractive index of 1.3 or less (preferably from 1.25 to 1.18). The refractive index described herein is a value as measured by an ordinary method using GES 5, available from SOPRA Company, with an angle of incidence being fixed at 75° and an angle of analysis at 45°.

EXAMPLES

In the following, the present invention will be described in more detail with reference to the Examples, but the present invention is not limited thereto. Details of the components used in the Examples and the Comparative Examples are as follows.

—Alkoxysilane Compound—

Tetraethoxysilane (manufactured by YAMANAKA Semiconductors Co., Ltd., electronics industry-grade, Si(OC$_2$H$_5$)$_4$).

—Siloxane Compound Represented by Formula (I)—

1,3,5,7-tetramethylcyclotetrasiloxane (cyclic siloxane compound manufactured by Trichemical Com., electronics industry-grade, (CH$_3$Si(H)O)$_4$).

—Surfactant (C)—

The surfactant was prepared by dissolving polyoxyethylene (20) stearyl ether (manufactured by Sigma Chemical Co., product name: Brij78, $C_{18}H_{37}(CH_2CH_2O)_{20}OH$) in ethanol for electronics industry, and subjecting this mixture to a metal removal treatment using an ion-exchange resin, until the concentration became 10 ppb or less.

—Element (D)—

Cesium (Cs) in an aqueous cesium acetate solution (manufactured by Wako Pure Chemical Industries, Ltd., special grade, $CsNO_3$).

—Disilyl Compound—

The disilyl compound was obtained by purifying hexamethyldisiloxane (manufactured by Aldrich Co., $((CH_3)_3Si)_2O$) by performing distillation.

—Water—

Pure water having a resistivity value of 18 MΩ or higher, subjected to a metal removal treatment.

—Organic Solvent—

Ethanol (manufactured by Wako Pure Chemical Industries, Ltd., electronics industry-grade, $C_2H_5OH$)

1-propyl alcohol (manufactured by Kanto Chemical Co., Inc., electronics industry-grade, $CH_3CH_2CH_2OH$)

2-butyl alcohol (manufactured by Kanto Chemical Co., Inc., electronics industry-grade, $CH_3(C_2H_5)CHOH$).

—Silylating Agent—

1,3,5,7-tetramethylcyclotetrasiloxane (manufactured by Trichemical Co., Ltd., electronics industry-grade, $(CH_3Si(H)O)_4$).

(Preparation of Precursor Solution)

90.9 g of tetraethoxysilane and 70.9 g of ethanol were mixed and stirred at room temperature, 80 mL of 1N acetic acid was then added thereto, and stirred at 50° C. for 1 hour. Subsequently, a solution prepared by dissolving 20.9 g of polyoxyethylene (20) stearyl ether in 280 g of ethanol was added dropwise and mixed. There after, the mixture was stirred at 30° C. for 4 hours. The obtained solution was concentrated to 90 g at 25° C. under reduced pressure of 30 hPa. After the concentration, a solution prepared by mixing 1-propyl alcohol and 2-butyl alcohol at a volume ratio of 1:1 was added, whereby 1885 g of a precursor solution was obtained.

<Measurement of Relative Dielectric Constant k>

The relative dielectric constant of the porous films prepared in the Examples and the Comparative Examples was measured by an ordinary method under an atmosphere of 25° C. and a relative humidity of 30%, at a frequency of 1 MHz, using a mercury probe device (SSM 5130).

In the measurement, when the leak current density is $1.0 \times 10^{-8}$ A/cm² or greater, it is not possible to measure a precise value of relative dielectric constant k as an insulating film for a semiconductor.

<Measurement of Mechanical Strength>

The elastic modulus of the porous films prepared in the Examples and the Comparative Examples was measured by an ordinary method using a nanoindentater (Hysitron, TriboScope), at a depth of indentation of 1/10 or less with respect to the film thickness.

<Evaluation of Storage Stability of Composition>

The compositions prepared in the Examples and the Comparative Examples were left to stand at room temperature for 50 days. Thereafter, 10 g of each composition was placed in a syringe, and a filtration filter (manufactured by ADVANTEC, DISMIC-13 JP, pore size: 0.20 µm, filter diameter: 13 mmφ) was attached to the tip of the syringe. The storage stability of the composition was evaluated by allowing the composition in the syringe to pass through the filtration filter.

Grade A was given to the composition that could be completely filtered without increasing the filtration pressure to higher than 0.10 MPa; grade B was given to the composition that could be completely filtered even though the filtration pressure was increased to 0.10 MPa or higher; and grade C was given to the composition that failed to be completely filtered due to the increase in the pressure.

<Measurement of FT-IR Spectrum of Porous Film>

The FT-IR spectrum (Fourier Transform Infrared Absorption Spectrum) of the porous films prepared in the Examples and the Comparative Examples was measured.

The measurement of FT-IR spectrum was conducted by an ordinary method using an FT-IR device (DIGILAB, DIGILAB Excalibur) while adjusting the support at an angle of incidence of 72° (Brewster angle of Si) with respect to the optical path.

Further, the measurement of FT-IR spectrum was carried out in a range of wavenumber of from 1800 $cm^{-1}$ to 4800 $cm^{-1}$.

<Measurement of Leak Current Density of Porous Film>

The leak current density of the porous films prepared in the Examples and the Comparative Examples was measured.

The leak current density was measured by an ordinary method using a mercury probe device (SSM 5130) under an atmosphere of 25° C. and a relative humidity of 30%, with a scanning voltage range of from 20 to −200 V at a frequency of 1 MHz.

Further, the measurement of the leak current density was conducted at 9 points within the silicon wafer.

The lower the leak current density is, the more favorable the porous film is as an interlayer insulating film or as an interwiring insulating film.

<Measurement of Density of Porous Film>

The density of the porous films prepared in the Examples and the Comparative Examples was measured.

The density was measured by an ordinary method using an XRD device (Rigaku Co., TPR-In-Plane) under the condition of an X-ray source of 50 kV, 300 mA, at a wavelength of 1.5418 angstroms, within a scanning range of from 0 to 1.5°.

Example 1

(Preparation of Composition for Forming Porous Film)

An aqueous solution of cesium nitrate was added to 300 g of the precursor solution until the Cs concentration was 15 ppm. Then, 1.7 g of 1,3,5,7-tetramethylcyclotetrasiloxane were added thereto and stirred at 25° C. for 1 hour, thereby obtaining a composition for forming a porous film. At this time, the addition amount of 1,3,5,7-tetramethylcyclotetrasiloxane was 10 mol % with respect to tetraethoxysilane.

The storage stability of the obtained composition is shown in Table 1.

(Formation of Porous Film)

1.0 mL of the composition for forming a porous film was applied to a surface of a silicon wafer by dropping the composition on the wafer and rotating the same at 2000 rpm for 60 seconds. Thereafter, the wafer was subjected to a heat treatment under a nitrogen atmosphere at 150° C. for 1 minute, and subsequently at 350° C. for 10 minutes. The resultant was heated to 350° C. in a chamber equipped with a 172-nm excimer lamp, and irradiated with ultraviolet rays for 10 minutes at a pressure of 1 Pa with an output of 14 mW/cm², thereby obtaining a porous film (porous silica film).

The density of the obtained porous film was 0.887 g/cm³.

Figure 2:
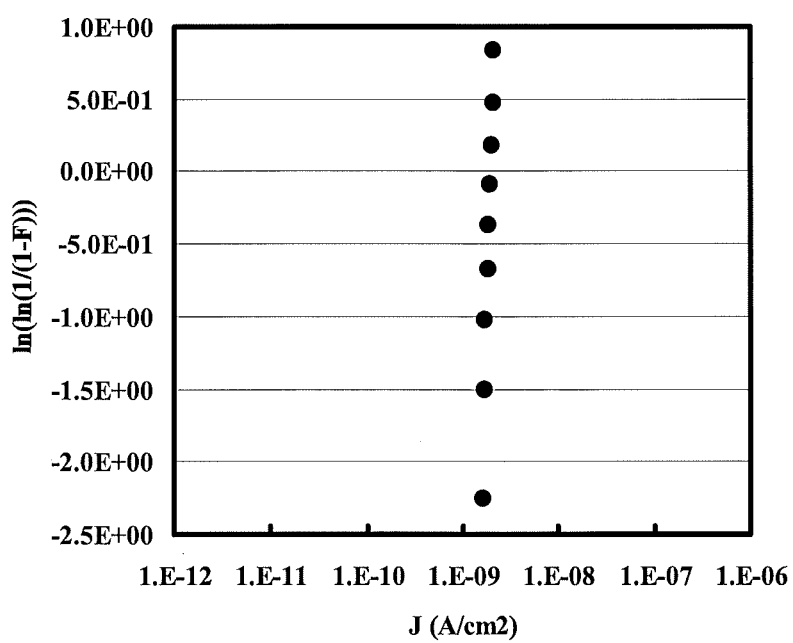
FIG. 2 is a graph showing the leak current density of the porous material according to Example 1.

The relative dielectric constant k and the elastic modulus E of the obtained porous film are shown in Table 1, the FT-IR spectrum is shown in FIG. 1, and the leak current density is shown in FIG. 2, respectively.

In the FT-IR spectrum shown in FIG. 1, the horizontal axis indicates the measured wavenumber (Wavenumber ($cm^{-1}$)), and the longitudinal axis indicates the absorption intensity (Absorbance (A.U.)) (A.U. refers to an arbitrary unit). Hereinafter, the same applies to the FT-IR spectrum as mentioned below.

As shown in FIG. 1, the FT-IR spectrum of the porous film had an absorption peak derived from an Si—O stretching movement of an SiOH group at around 3600 $cm^{-1}$ to 3800 $cm^{-1}$ (peak (II), intensity I (II)); an absorption peak derived from a C—H stretching movement of an alkyl group (peak (I), intensity I (I)) at around 2900 $cm^{-1}$ to 3100 $cm^{-1}$; and an absorption peak derived from an Si—H stretching movement of an $HSiO_3$ group at around 2200 $cm^{-1}$ to 2300 $cm^{-1}$ (peak (III), intensity I (III)).

The intensity ratio (I (II)/I (I)) and the intensity ratio (I (III)/I (I)) are shown in Table 1.

Further, the FT-IR spectrum of the porous film had an absorption peak derived from an Si—H stretching movement of a $H(CH_3)SiO_2$ group at around 2100 $cm^{-1}$ to 2200 $cm^{-1}$ (at the lower wavenumber-side of peak (III)) (peak (IV), intensity I (IV)).

However, as shown in FIG. 1, the intensity of peak (IV) was extremely weak. The intensity ratio (I (IV)/I (III)) was 0.12.

In FIG. 2, the horizontal axis indicates a leak current density J ($A/cm^2$), and the longitudinal axis indicates a Weibull distribution (ln(ln(1/(1−F)))). In FIG. 2, the leak current densities measured at 9 points in the silicon wafer are plotted. The same applies to the measurement results of the peak current density as described later.

As shown in FIG. 2, the leak current density was around $1.0 \times 10^{-9}$ $A/cm^2$ at 9 points out of the 9 measurement points, indicating that the leak current density was sufficiently low and that the distribution thereof in the film surface was favorable.

Example 2

A porous silica film was formed in the same manner as in Example 1, except that the amount of 1,3,5,7-tetramethylcyclotetrasiloxane was changed to 3.4 g in the preparation of the composition for forming a porous film. At this time, the addition amount of 1,3,5,7-tetramethylcyclotetrasiloxane in the composition was 20 mol % with respect to tetraethoxysilane.

The density of the obtained porous film was 0.879 $g/cm^3$.

Figure 3:
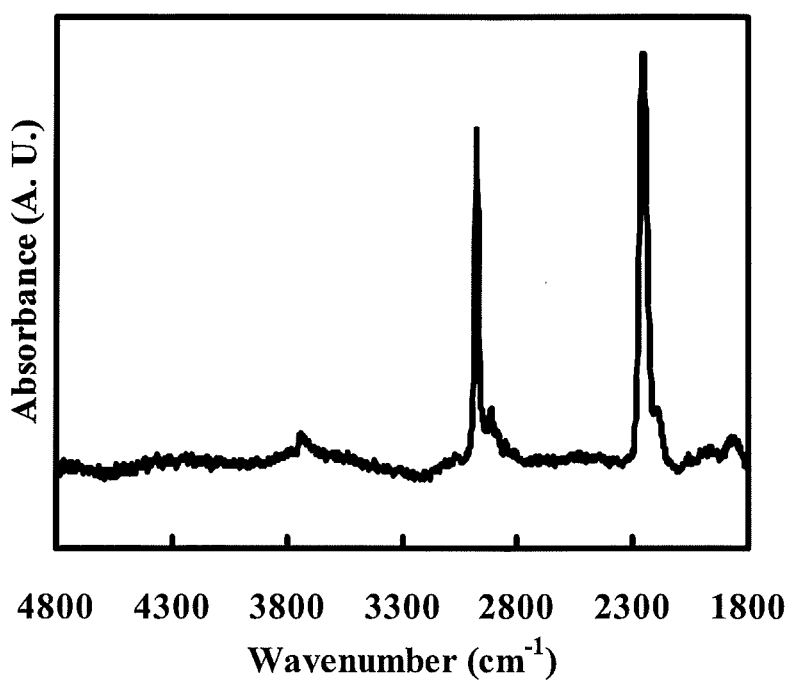
FIG. 3 is an FT-IR spectrum of the porous material according to Example 2.
Figure 4:
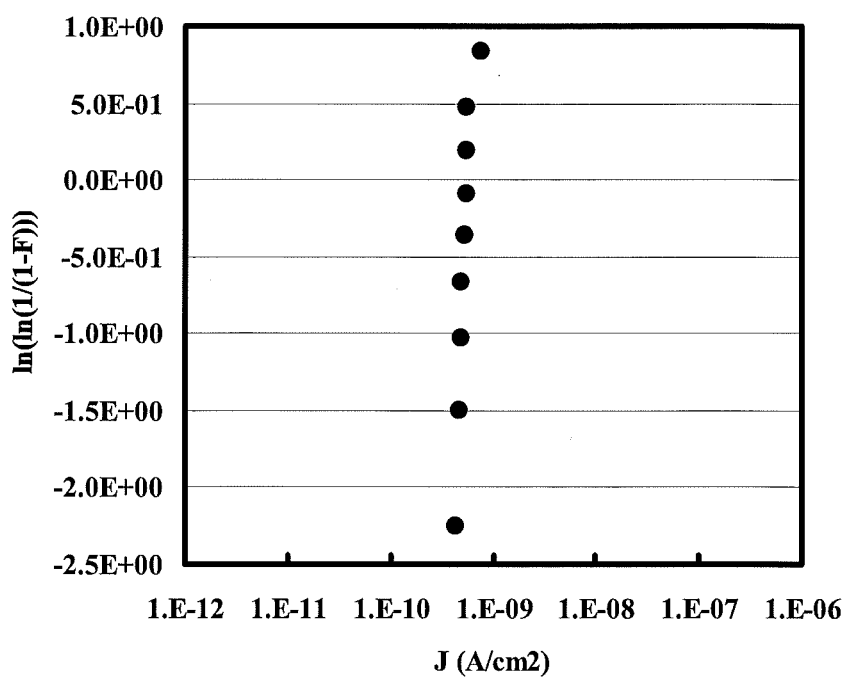
FIG. 4 is a graph showing the leak current density of the porous material according to Example 2.

Further, the relative dielectric constant k and the elastic modulus E of the obtained porous silica film are shown in Table 1, the FT-IR spectrum is shown in FIG. 3, and the leak current density is shown in FIG. 4, respectively.

As shown in FIG. 3, the FT-IR spectrum of the porous film had peaks (I) to (IV) as with Example 1, but intensity I (II) was smaller than that of Example 1. The intensity ratio (I (II)/I (I)) and the intensity ratio (I (III)/I (I)) are shown in Table 1.

Also, the intensity ratio (I (IV)/I (III)) was 0.15.

Further, as shown in FIG. 4, the leak current density was around $1.0 \times 10^{-9}$ $A/cm^2$ or less at 9 points out of the 9 measurement points, indicating that the leak current density was sufficiently low.

Example 3

A porous silica film was formed in the same manner as in Example 1, except that 1.1 g of hexamethyldisiloxane were further added in the preparation of the composition for forming a porous film. At this time, the addition amount of hexamethyldisiloxane in the composition was 10 mol % with respect to tetraethoxysilane.

The density of the obtained porous film was 0.883 $g/cm^3$.

Figure 5:
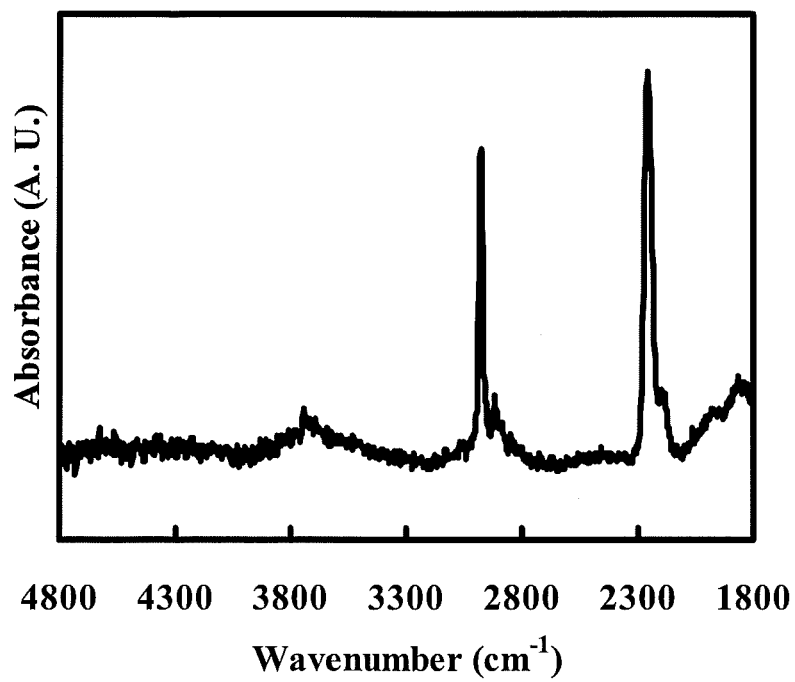
FIG. 5 is an FT-IR spectrum of the porous material according to Example 3.
Figure 6:
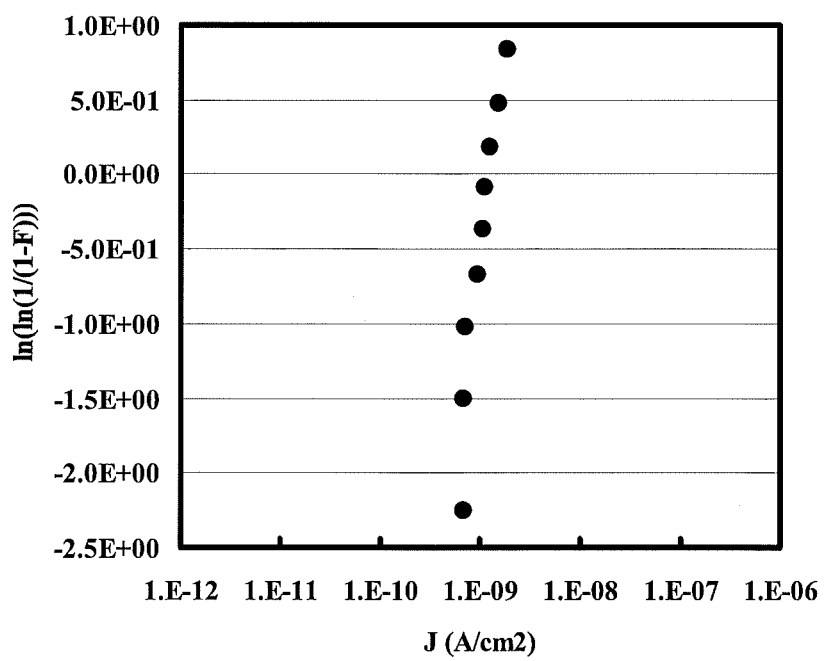
FIG. 6 is a graph showing the leak current density of the porous material according to Example 3.

Further, the relative dielectric constant k and the elastic modulus E are shown in Table 1, the FT-IR spectrum is shown in FIG. 5, and the leak current density is shown in FIG. 6, respectively.

Subsequently, in order to evaluate the storage stability of the composition for forming a porous film, the composition was stored in a refrigerator (temperature: 5° C.), and a porous film was formed using the composition after the storage. The relative dielectric constant k of the obtained porous film was measured.

Figure 7:
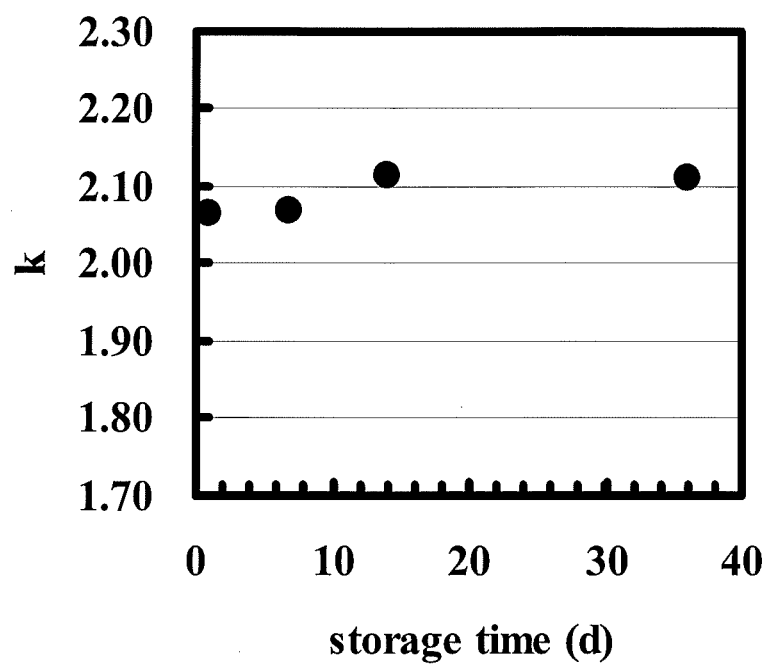
FIG. 7 is a graph showing the relationship between the storage days (storage time (d)) and the relative dielectric constant k of the porous material according to Example 3.

FIG. 7 is a graph showing the relationship between the storage days (storage time (d)) of the composition for forming a porous film under the above-described conditions and the relative dielectric constant k of the porous film formed by using the composition.

As shown in FIG. 7, the relative dielectric constants (k) in 36 days from a time immediately after starting the storage (storage time (d)) were around 2.10. These results show that the composition for forming a porous film maintained a stable state with less variation with respect to the storage time.

As shown in FIG. 5, the FT-IR spectrum of the porous film had peaks (I) to (IV) as with Example 1, but intensity I (II) was smaller than that of Example 1. The intensity ratio (I (II)/I (I)) and the intensity ratio (I (III)/I (I)) are shown in Table 1.

Also, the intensity ratio (I (IV)/I (III)) was 0.16.

Further, as shown in FIG. 6, the leak current density was around $1.0 \times 10^{-9}$ $A/cm^2$ at 9 points out of the 9 measurement points, indicating that the leak current density was sufficiently low.

Example 4

A porous silica film was formed in the same manner as in Example 1, except that the addition amount of 1,3,5,7-tetramethylcyclotetrasiloxane was changed from 1.7 g to 0.8 g, and 1.7 g of hexamethyldisiloxane were further added in the preparation of the composition for forming a porous film. At this time, the addition amounts of 1,3,5,7-tetramethylcyclotetrasiloxane and hexamethyldisiloxane in the composition were 5 mol % and 15 mol %, respectively, with respect to tetraethoxysilane.

Figure 8:
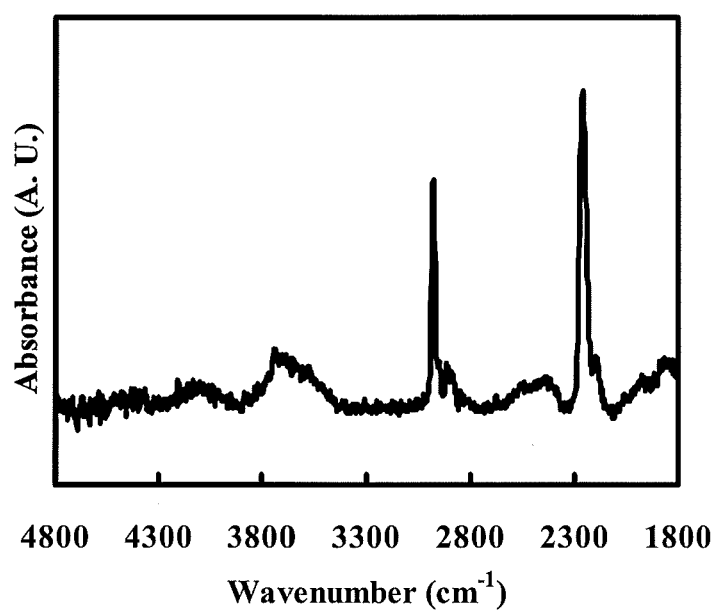
FIG. 8 is an FT-IR spectrum of the porous material according to Example 4.
Figure 9:
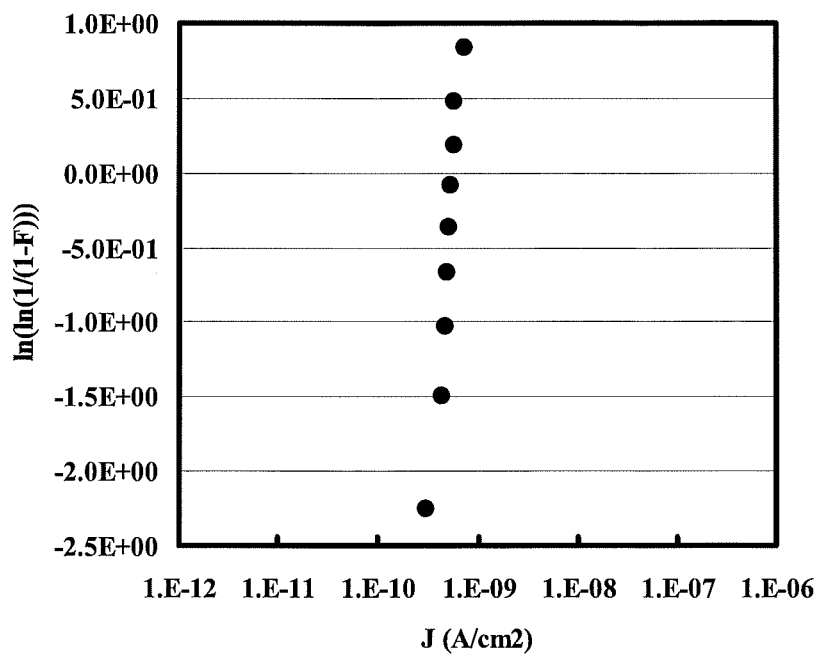
FIG. 9 is a graph showing the leak current density of the porous material according to Example 4.

The relative dielectric constant k and the elastic modulus E of the obtained porous film are shown in Table 1, the FT-IR spectrum is shown in FIG. 8, and the leak current density is shown in FIG. 9, respectively.

As shown in FIG. 8, the FT-IR spectrum of the porous film had peaks (I) to (IV) as with Example 1. The intensity ratio (I (II)/I (I)) and the intensity ratio (I (III)/I (I)) are shown in Table 1.

Also, the intensity ratio (I (IV)/I (III)) was 0.18.

Further, as shown in FIG. 9, the leak current density was around $1.0 \times 10^{-9}$ $A/cm^2$ at 9 points out of the 9 measurement points, indicating that the leak current density was sufficiently low.

Example 5

The porous film obtained in Example 4 was heated to 350° C., and 1,3,5,7-tetramethylcyclotetrasiloxane was introduced thereto in an amount of 1 g/minute at a pressure of 30 kPa, and the resultant was subjected to a silylation treatment for 90 minutes.

Figure 10:
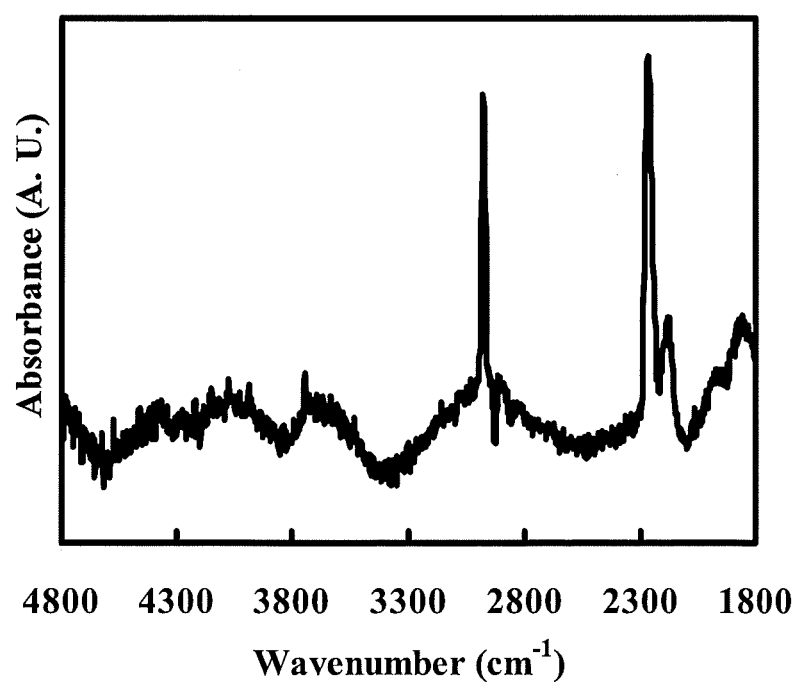
FIG. 10 is an FT-IR spectrum of the porous material according to Example 5.
Figure 11:
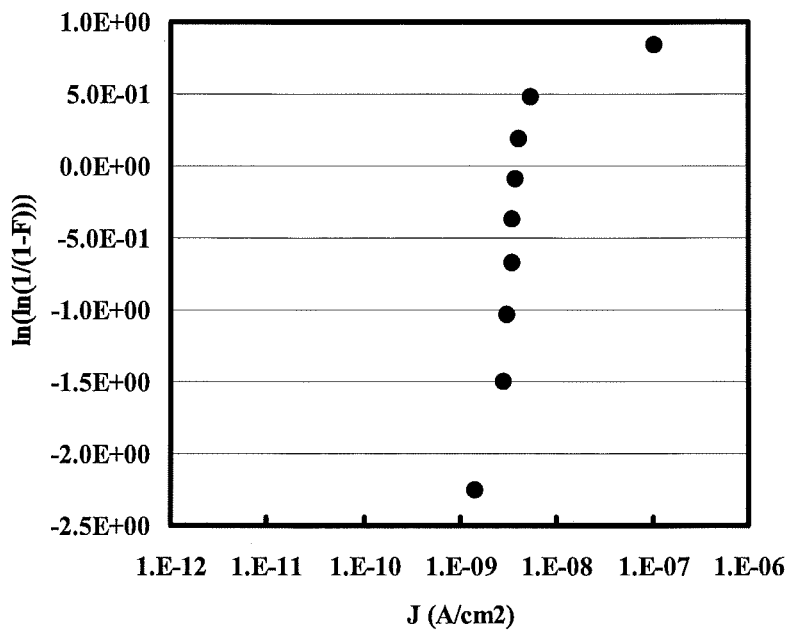
FIG. 11 is a graph showing the leak current density of the porous material according to Example 5.

The relative dielectric constant k and the elastic modulus E of the obtained porous film are shown in Table 1, the FT-IR spectrum is shown in FIG. 10, and the leak current density is shown in FIG. 11, respectively.

As shown in FIG. 10, the FT-IR spectrum of the porous film had peaks (I) to (IV) as with Example 1.

The intensity ratio (I (II)/I (I)) and the intensity ratio (I (III)/I (I)) are shown in Table 1.

As shown in FIG. 10, the intensity of peak (IV) was greater than those of Examples 1 to 4. The intensity ratio (I (IV)/I (III)) was 0.32.

Further, as shown in FIG. 11, the leak current density was around $1.0 \times 10^{-8}$ to $1.0 \times 10^{-9}$ A/cm$^2$ at 8 points out of the 9 measurement points, indicating that the leak current density was low.

Example 6

A porous silica film was formed in the same manner as in Example 1, except that 0.95 g of tetramethyldisiloxane were further added in the preparation of the composition for forming a porous film. At this time, the addition amount of tetramethyldisiloxane in the composition was 10 mol % with respect to tetraethoxysilane.

Figure 12:
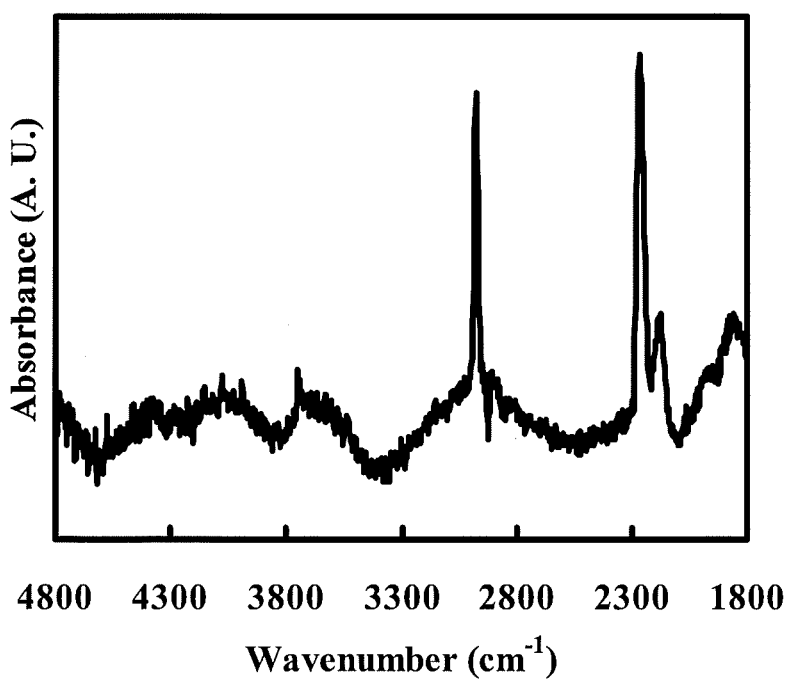
FIG. 12 is an FT-IR spectrum of the porous material according to Example 6.
Figure 13:
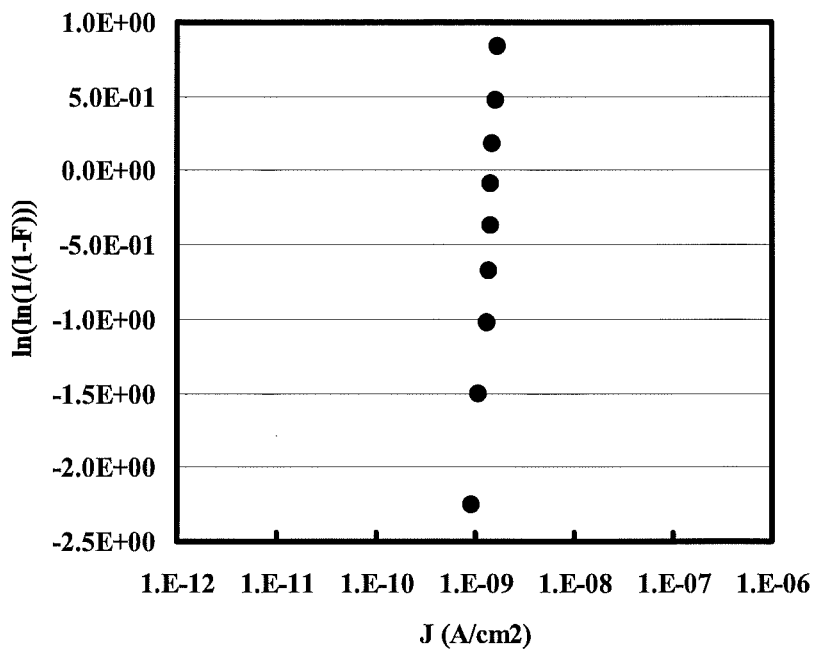
FIG. 13 is a graph showing the leak current density of the porous material according to Example 6.

The relative dielectric constant k and the elastic modulus E of the obtained porous film are shown in Table 1, the FT-IR spectrum is shown in FIG. 12, and the leak current density is shown in FIG. 13, respectively.

As shown in FIG. 12, the FT-IR spectrum of the porous film had a similar absorption peak to that of Example 1. It also had an absorption peak derived from an Si—H stretching movement of an H(CH$_3$)SiO$_2$ group (peak (IV), intensity I (IV))) at around 2100 cm$^{-1}$ to 2200 cm$^{-1}$ (at the lower wavenumber-side of peak (III)).

Also, as shown in FIG. 11, the intensity of peak (IV) was greater than that of Examples 1 to 4.

The intensity ratio (I (IV)/I (III)) was 0.32.

The intensity ratio (I (II)/I (I)) and the intensity ratio (I (III)/I (I)) are shown in Table 1.

Further, as shown in FIG. 13, the leak current density was around $1.0 \times 10^{-9}$ A/cm$^2$ at 9 points out of the 9 measurement points, indicating that the leak current density was low.

Comparative Example 1

A porous silica film was formed in the same manner as in Example 1, except that the Cs concentration was changed from 15 ppm to 0 ppm in the preparation of the composition for forming a porous film.

Figure 14:
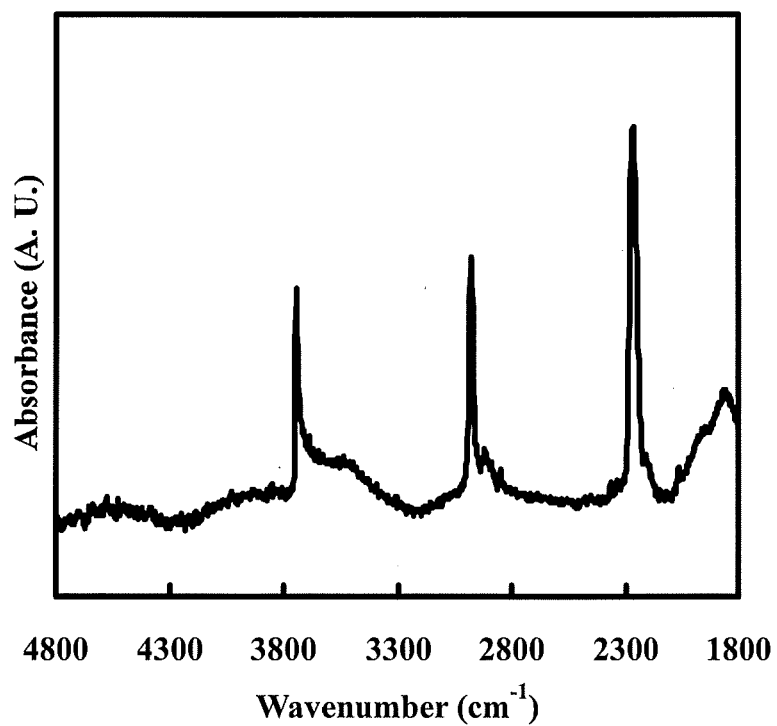
FIG. 14 is an FT-IR spectrum of the porous material according to Comparative Example 1.
Figure 15:
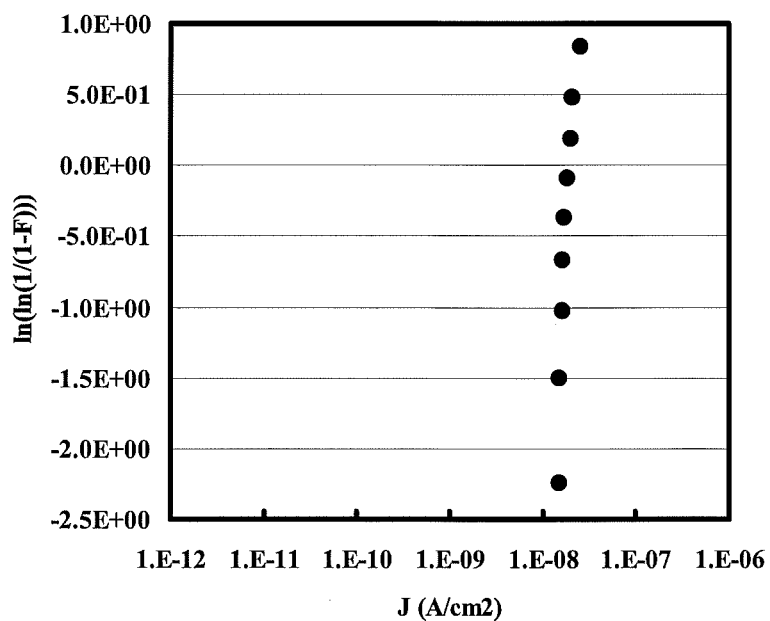
FIG. 15 is a graph showing the leak current density of the porous material according to Comparative Example 1.

The relative dielectric constant k and the elastic modulus E of the obtained porous film are shown in Table 1, the FT-IR spectrum is shown in FIG. 14, and the leak current density is shown in FIG. 15, respectively.

It was not possible to conduct a precise measurement of the relative dielectric constant k due to the high leak current density, as described below.

As shown in FIG. 14, the FT-IR spectrum of the porous film had a similar absorption peak to that of Example 1, but intensity I (II) was greater than that of Examples 1 to 6. The intensity ratio (I (II)/I (I)), the intensity ratio (I (III)/I (I)), and the porosity of the porous film are shown in Table 1.

Further, as shown in FIG. 15, the leak current density was not less than $1.0 \times 10^{-8}$ A/cm$^2$ at 9 points out of the 9 measurement points, indicating that the leak current density was higher than that of Examples 1 to 6.

Comparative Example 2

A porous silica film was formed in the same manner as in Example 1, except that the addition amount of 1,3,5,7-tetramethylcyclotetrasiloxane was changed from 1.7 g to 0 g in the preparation of the composition for forming a porous film.

Figure 16:
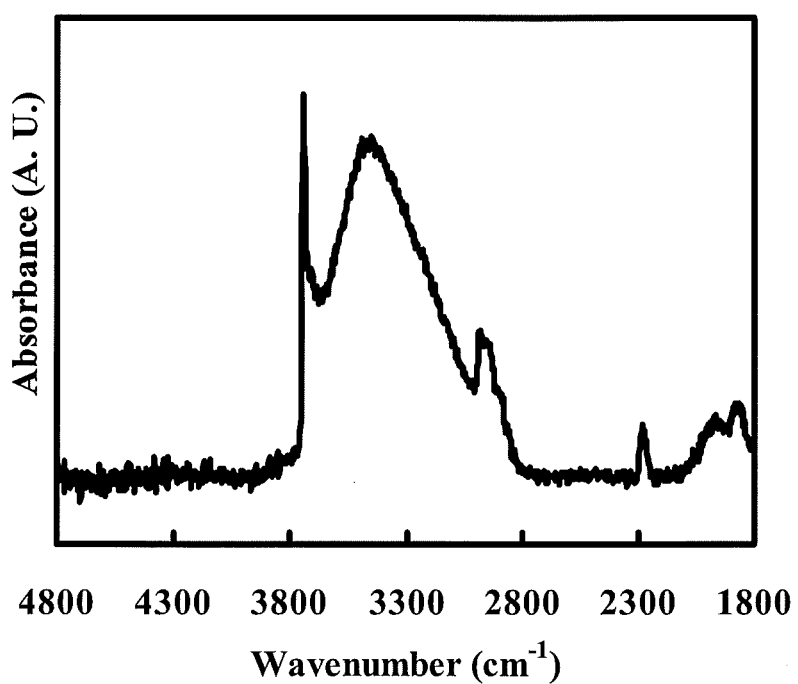
FIG. 16 is an FT-IR spectrum of the porous material according to Comparative Example 2.

The elastic modulus E and the FT-IR spectrum of the obtained porous film are shown in Table 1 and FIG. 16, respectively.

The insulating property of the obtained film was poor, and it was not possible to measure the leak current density and the relative dielectric constant k.

The reason why the measurement of the leak current density and the relative dielectric constant k was not possible is thought to be that the SiOH peak (peak (II)) in the film was too large, as shown from the FT-IR spectrum in FIG. 16.

The intensity ratio (I (II)/I (I)) and the intensity ratio (I (III)/I (I)) are shown in Table 1.

Comparative Example 3

A porous silica film was formed in the same manner as in Example 1, except that the addition amount of 1,3,5,7-tetramethylcyclotetrasiloxane was changed from 1.7 g to 0 g and 2.36 g of hexamethyldisiloxane were further added in the preparation of the composition for forming a porous film. At this time, the addition amount of hexamethyldisiloxane in the composition was 20 mol % with respect to tetraethoxysilane.

Figure 17:
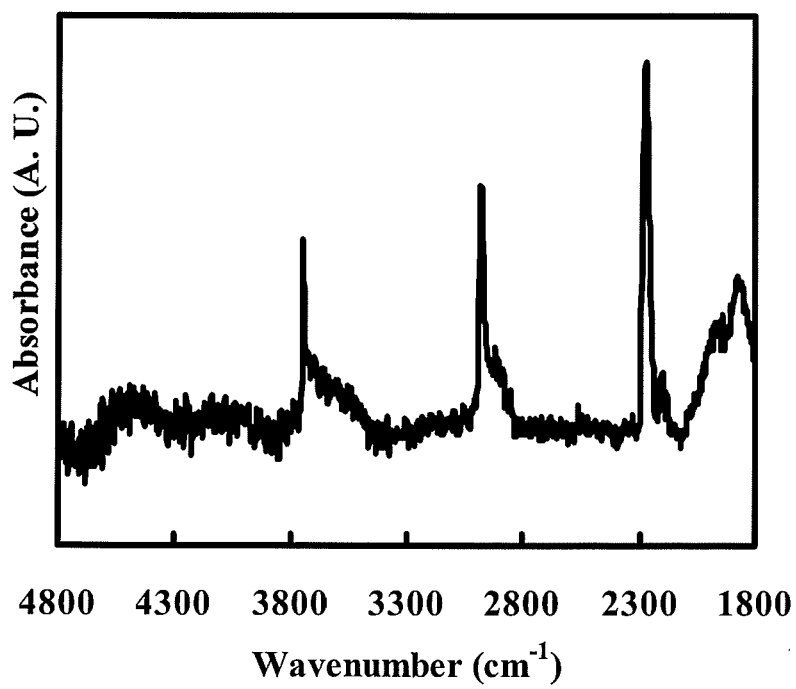
FIG. 17 is an FT-IR spectrum of the porous material according to Comparative Example 3.
Figure 18:
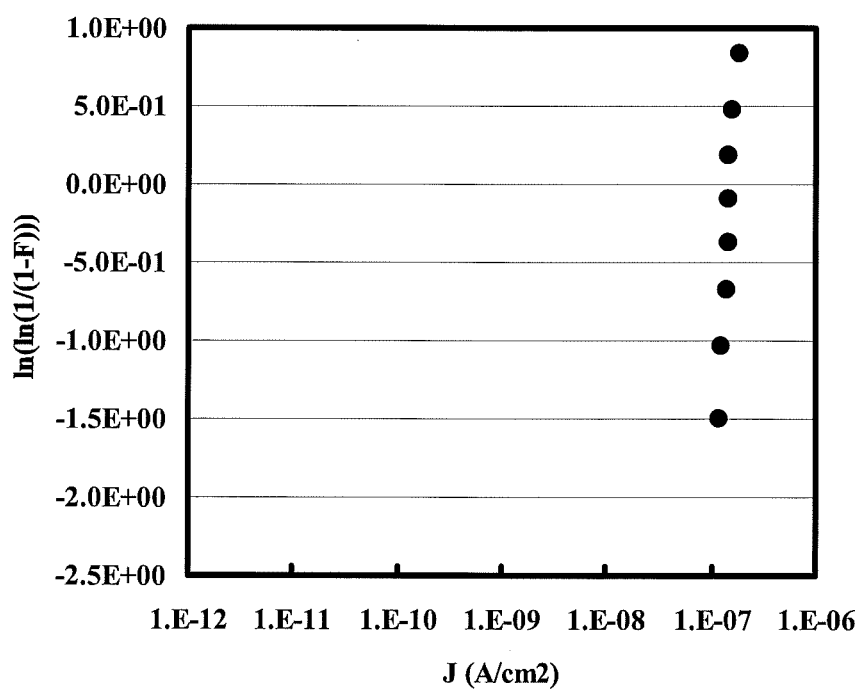
FIG. 18 is a graph showing the leak current density of the porous material according to Comparative Example 3.

The elastic modulus E, the FT-IR spectrum and the leak current density of the obtained porous film are shown in Table 1, FIG. 17 and FIG. 18, respectively.

It was not possible to conduct a precise measurement of the relative dielectric constant k, due to the high leak current density as described below.

As shown in FIG. 17, the FT-IR spectrum of the porous film had a similar absorption peak to that of Example 1, but intensity I (II) was higher than that of Examples 1 to 6.

The intensity ratio (I (II)/I (I)) and the intensity ratio (I (III)/I (I)) are shown in Table 1.

Further, as shown in FIG. 18, the leak current density was not less than $1.0 \times 10^{-7}$ A/cm$^2$ at 8 points out of the 9 measurement points, indicating that the leak current density was higher than that of Examples 1 to 6. It was not possible to measure the leak current density at one measurement point.

Comparative Example 4

A porous silica film was formed in the same manner as in Example 1, except that the addition amount of 1,3,5,7-tetramethylcyclotetrasiloxane was changed from 1.7 g to 0.8 g, 1.7 g of hexamethyldisiloxane were added, and the Cs concentration was changed from 15 ppm to 0 ppm, in the preparation of the composition for forming a porous film. At this time, the addition amounts of 1,3,5,7-tetramethylcyclotetrasiloxane and hexamethyldisiloxane in the composition were 5 mol % and 15 mol %, respectively, with respect to tetraethoxysilane.

Figure 19:
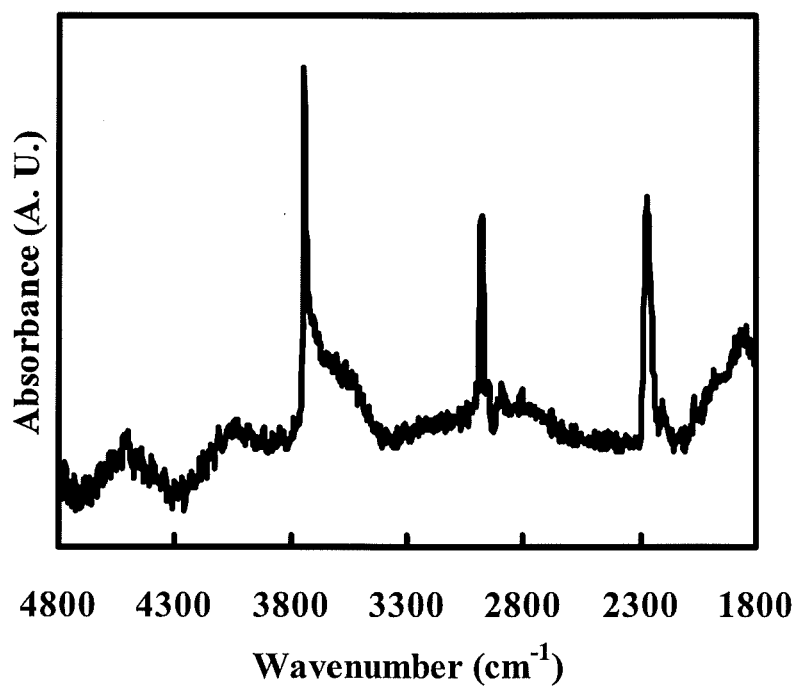
FIG. 19 is an FT-IR spectrum of the porous material according to Comparative Example 4.
Figure 20:
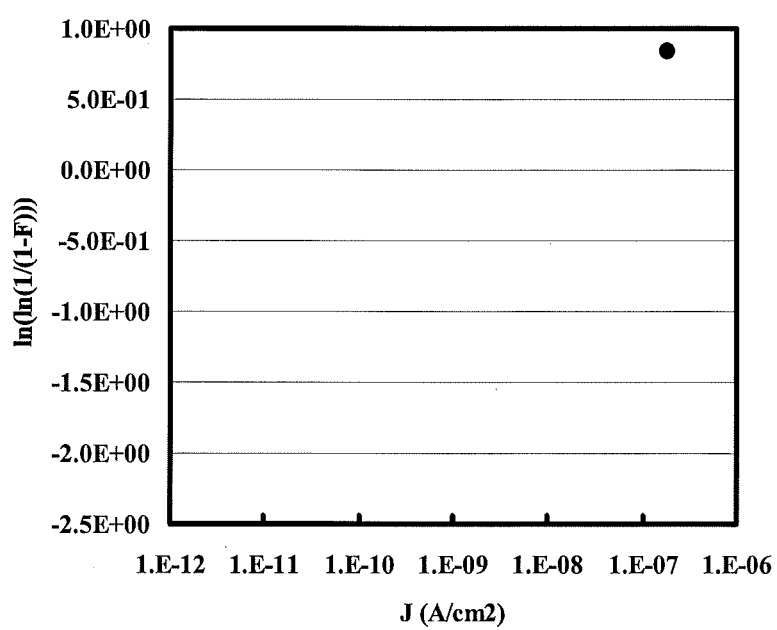
FIG. 20 is a graph showing the leak current density of the porous material according to Comparative Example 4.

The elastic modulus E, the FT-IR spectrum and the leak current density of the obtained porous film are shown in Table 1, FIG. 19 and FIG. 20, respectively.

The insulation property of the obtained film was poor, and it was not possible to measure the leak current density at 8 points out of the 9 measurement points in the film surface (FIG. 20). It was not possible to conduct a precise measurement of the dielectric constant k due to the poor insulation property of the film.

The reason for this is thought to be the large SiOH peak in the film, as shown from the FT-IR spectrum in FIG. 20.

The intensity ratio (I (II)/I (I)) and the intensity ratio (I (III)/I (I)) are shown in Table 1.

TABLE 1

| Examples | Addition amount with respect to alkoxysilane compound (mol %) | | Element (D) concentration (ppm) | Relative dielectric constant k | Elastic modulus E (GPa) | Storage stability of composition | I (II)/I (I) | I (III)/I (I) |
|---|---|---|---|---|---|---|---|---|
| | Siloxane compound (Note 1) | Disilyl compound (Note 2) | | | | | | |
| Example 1 | 10 | 0 | 15 | 2.0 | 6.60 | B | 0.23 | 1.35 |
| Example 2 | 20 | 0 | 15 | 2.0 | 5.03 | B | 0.09 | 1.23 |
| Example 3 | 10 | 10 | 15 | 2.0 | 6.80 | A | 0.17 | 1.23 |
| Example 4 | 5 | 15 | 15 | 2.1 | 6.90 | A | 0.27 | 1.39 |
| Example 5 | 5 | 15 | 15 | 2.0 | 7.13 | A | 0.21 | 1.12 |
| Example 6 | 10 | 10 | 15 | 2.1 | 5.72 | A | 0.21 | 1.12 |
| Comparative Example 1 | 10 | 0 | 0 | — (Note 3) | 3.41 | C | 0.89 | 1.53 |
| Comparative Example 2 | 0 | 0 | 15 | — (Note 3) | 2.36 | C | 2.71 | 0.36 |
| Comparative Example 3 | 0 | 20 | 15 | — (Note 3) | 5.76 | A | 0.78 | 1.52 |
| Comparative Example 4 | 5 | 15 | 0 | — (Note 3) | 5.04 | A | 1.65 | 1.12 |

(Note 1)
(moles of siloxane compound represented by Formula (I)/moles of alkoxysilane compound) × 100
(Note 2)
(moles of disilyl compound/moles of alkoxysilane compound) × 100
(Note 3)
In Comparative Examples 1 to 4, precise measurement of the relative dielectric constant k was not possible due to the high leak current density (poor insulation property of the film).

As shown in Table 1, the porous films prepared by using the compositions of Examples 1 to 6, each including (A) a hydrolysate of an alkoxysilane compound, (B) a hydrolysate of a specific siloxane compound, (C) a surfactant and (D) an element having an electronegativity of 2.5 or less, exhibited both a low relative dielectric constant k and a high elastic modulus E. Further, the compositions prepared in Examples 1 to 6 (in particular, Examples 3 to 6) exhibited excellent storage stability.

The disclosure of Japanese Patent Application No. 2008-096449 is hereby incorporated by reference in its entirety.

All references, patent applications, and technical regulations as cited in the present specification are hereby incorporated by reference to the same extent as if each reference, patent application, and technical regulation were specifically and individually set forth herein.

The invention claimed is:

1. A composition comprising:
(A) a hydrolysate of an alkoxysilane compound;
(B) a hydrolysate of a siloxane compound represented by the following Formula (1);
(C) a surfactant;
(D) an element having an electronegativity of 2.5 or less:

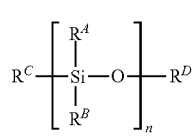
(1)

wherein in Formula (1), $R^A$ and $R^B$ each independently represent a hydrogen atom, a phenyl group, $-C_aH_{2a+1}$, $-(CH_2)_b(CF_2)_cCF_3$ or $-C_dH_{2d-1}$, and $R^A$ and $R^B$ are not both hydrogen atoms simultaneously, $R^C$ and $R^D$ represent a single bond that links a silicon atom and an oxygen atom to form a cyclic siloxane structure, or each independently represent a hydrogen atom, a phenyl group, $-C_aH_{2a+1}$, $-(CH_2)_b(CF_2)_cCF_3$ or $-C_dH_{2d-1}$, a represents an integer of 1 to 6, b represents an integer of 0 to 4, c represents an integer of 0 to 10, d represents an integer of 2 to 4, and n represents an integer of 3 or greater; and
(E) a hydrolysate of a disilyl compound represented by the following Formula (3):

$$R^{14}R^{15}R^{16}Si-X-SiR^{17}R^{18}R^{19} \qquad (3)$$

wherein in Formula (3), $R^{14}$, $R^{15}$, $R^{16}$, $R^{17}$, $R^{18}$ and $R^{19}$ each independently represent a hydrogen atom, a phenyl group, $-C_aH_{2a+1}$ or $-(CH_2)_b(CF_2)_cCF_3$, a represents an integer of 1 to 3, b represents an integer of 0 to 4, c represents an integer of 0 to 10, X represents an oxygen atom or $>NR^{20}$, $R^{20}$ represents a hydrogen atom or $-C_eH_{2e+1}$ and e represents an integer of 1 to 3.

2. The composition according to claim 1, wherein the siloxane compound represented by Formula (1) is a cyclic siloxane compound.

3. The composition according to claim 1, wherein the siloxane compound represented by Formula (1) is a cyclic siloxane compound represented by the following Formula (2):

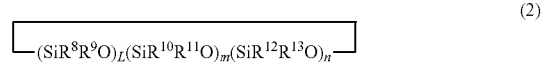
(2)

wherein in Formula (2), $R^8$, $R^9$, $R^{10}$, $R^{11}$, $R^{12}$ and $R^{13}$ each independently represent a hydrogen atom, a phenyl group, $-C_aH_{2a+1}$, $-(CH_2)_b(CF_2)_cCF_3$ or $-C_dH_{2d-1}$, $R^8$ and $R^9$ are not both hydrogen atoms simultaneously, $R^{10}$ and $R^{11}$ are not both hydrogen atoms simultaneously, $R^{12}$ and $R^{13}$ are not both hydrogen atoms simultaneously, a represents an integer of 1 to 3, b represents an integer of 0 to 4, c represents an integer of 0 to 10, d represents an integer of 2 to 4, L represents an integer of 0 to 8, m represents an integer of 0 to 8, n represents an integer of 0 to 8, and L, m and n satisfy the relationship $3 \leq L+m+n \leq 8$.

4. The composition according to claim 1, wherein (D) the element having an electronegativity of 2.5 or less is an element having an ion radius of 1.6 angstroms or more.

5. The composition according to claim 1, wherein (D) the element having an electronegativity of 2.5 or less is an element having an atomic weight of 130 or more.

6. The composition according to claim 1, wherein (D) the element having an electronegativity of 2.5 or less is at least one element selected from the group consisting of Cs, Ba, La, Hf, Ta, W and a lanthanoid.

7. A method for producing a composition, the method at least comprising:
    a step of mixing at least an alkoxysilane compound, a catalyst and an organic solvent at 20° C. to 70° C. for 0.5 hours to 7 hours;
    a step of adding a surfactant to a mixture obtained by the mixing;
    a step of concentrating the mixture to which the surfactant has been added until the mass of the mixture becomes 10% to 50%;
    a step of diluting the concentrated mixture with an organic solvent;
    a step of adding an element having an electronegativity of 2.5 or less to the diluted mixture; and
    a step of adding a siloxane compound represented by the following Formula (1), and a disilyl compound represented by the following formula (3) to the mixture to which the element has been added:

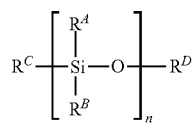
(1)

wherein in Formula (1), $R^A$ and $R^B$ each independently represent a hydrogen atom, a phenyl group, $-C_aH_{2a+1}$, $-(CH_2)_b(CF_2)_cCF_3$ or $-C_dH_{2d-1}$, and $R^A$ and $R^B$ are not both hydrogen atoms simultaneously, $R^C$ and $R^D$ represent a single bond that links a silicon atom and an oxygen atom to form a cyclic siloxane structure, or each independently represent a hydrogen atom, a phenyl group, $-C_aH_{2a+1}$, $-(CH_2)_b(CF_2)_cCF_3$ or $-C_dH_{2d-1}$, a represents an integer of 1 to 6, b represents an integer of 0 to 4, c represents an integer of 0 to 10, d represents an integer of 2 to 4, and n represents an integer of 3 or greater, $$R^{14}R^{15}R^{16}Si-X-SiR^{17}R^{18}R^{19} \qquad (3)$$

wherein in Formula (3), $R^{14}$, $R^{15}$, $R^{16}$, $R^{17}$, $R^{18}$ and $R^{19}$ each independently represent a hydrogen atom, a phenyl group, $-C_aH_{2a+1}$ or $-(CH_2)_b(CF_2)_cCF_3$, a represents an integer of 1 to 3, b represents an integer of 0 to 4, c represents an integer of 0 to 10, X represents an oxygen atom or $>NR^{20}$, $R^{20}$ represents a hydrogen atom or $-C_eH_{2e+1}$, and e represents an integer of 1 to 3.

8. A method for forming a porous material, the method comprising:
    a step of forming a composition layer by drying the composition according to claim 1;
    a step of heating the formed composition layer at 80° C. to 400° C.; and
    a step of irradiating the heated composition layer with ultraviolet rays.

9. The method for forming a porous material according to claim 8, further comprising a step of carrying out a contact reaction treatment of the composition layer and a silylating agent, after the step of irradiating with ultraviolet rays.

* * * * *